US010957845B2

(12) United States Patent
Noh et al.

(10) Patent No.: US 10,957,845 B2
(45) Date of Patent: Mar. 23, 2021

(54) MAGNETIC MEMORY DEVICES AND METHODS OF FABRICATING THE SAME

(71) Applicant: Samsung Electronics Co., Ltd., Suwon-si (KR)

(72) Inventors: Eunsun Noh, Yongin-si (KR); Juhyun Kim, Yongin-si (KR); Whankyun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/442,991

(22) Filed: Jun. 17, 2019

(65) Prior Publication Data
US 2020/0168664 A1 May 28, 2020

(30) Foreign Application Priority Data

Nov. 23, 2018 (KR) .......................... 10-2018-0146016

(51) Int. Cl.
H01L 43/04 (2006.01)
H01L 27/22 (2006.01)
H01L 43/02 (2006.01)
H01L 43/08 (2006.01)
H01L 43/12 (2006.01)

(52) U.S. Cl.
CPC ............ *H01L 43/04* (2013.01); *H01L 27/224* (2013.01); *H01L 43/02* (2013.01); *H01L 43/08* (2013.01); *H01L 43/12* (2013.01)

(58) Field of Classification Search
CPC ....... H01L 27/224; H01L 43/02; H01L 43/04; H01L 43/08
See application file for complete search history.

(56) References Cited

U.S. PATENT DOCUMENTS

| 7,732,881 | B2 | 6/2010 | Wang |
| 8,474,127 | B2 | 7/2013 | Gill et al. |
| 9,306,156 | B2 | 4/2016 | Noh et al. |
| 9,460,397 | B2 | 10/2016 | Apalkov et al. |
| 9,508,925 | B2 | 11/2016 | Pi et al. |
| 9,542,987 | B2 | 1/2017 | Naik et al. |
| 9,830,966 | B2 | 11/2017 | Mihajlovic et al. |
| 10,128,433 | B2 | 11/2018 | Pi et al. |
| 2015/0213867 | A1 | 7/2015 | Wu et al. |
| 2019/0051815 | A1* | 2/2019 | Kakinuma ............ H01L 43/06 |
| 2019/0172999 | A1* | 6/2019 | Chia .................... H01F 10/3272 |
| 2020/0161542 | A1* | 5/2020 | Ahn ....................... H01L 43/02 |

FOREIGN PATENT DOCUMENTS

| CN | 107658382 A | 2/2018 |
| JP | 5601976 B2 | 10/2014 |
| KR | 10-2015-0040238 A | 4/2015 |
| KR | 10-2016-0031832 A | 3/2016 |

* cited by examiner

Primary Examiner — Cheung Lee
(74) Attorney, Agent, or Firm — Harness, Dickey & Pierce, P.L.C.

(57) ABSTRACT

Provided are magnetic memory devices and method of fabricating the same. The magnetic memory device includes a magnetic tunnel junction pattern disposed on a substrate and including a free layer, a tunnel barrier layer and a pinned layer which are sequentially stacked, and a first spin-orbit torque (SOT) line being in contact with a first sidewall of the free layer of the magnetic tunnel junction pattern.

18 Claims, 26 Drawing Sheets

MAGNETIC MEMORY DEVICES AND METHODS OF FABRICATING THE SAME

CROSS-REFERENCE TO RELATED APPLICATION

This U.S. non-provisional patent application claims priority under 35 U.S.C. § 119 to Korean Patent Application No. 10-2018-0146016, filed on Nov. 23, 2018, in the Korean Intellectual Property Office, the disclosure of which is hereby incorporated by reference in its entirety.

BACKGROUND

Example embodiments of the inventive concepts relate to a semiconductor device and a method of fabricating the same and, more particularly, to magnetic memory devices and methods of fabricating the same.

Magnetic memory devices may operate as high-speed and/or low-voltage semiconductor memory devices that may be included in high-speed and/or low power consumption electronic devices.

A magnetic memory device may include a magnetic tunnel junction (MTJ). The magnetic tunnel junction may include two magnetic layers and an insulating layer disposed between the two magnetic layers. A resistance value of the magnetic tunnel junction may be changed depending on magnetization directions of the two magnetic layers. For example, when the magnetization directions of the two magnetic layers are anti-parallel to each other, the magnetic tunnel junction may have a relatively high resistance value. When the magnetization directions of the two magnetic layers are parallel to each other, the magnetic tunnel junction may have a relatively low resistance value. The magnetic memory device may read/write data using a difference between the resistance values of the magnetic tunnel junction.

SUMMARY

Some example embodiments of the inventive concepts may provide highly integrated and/or low-power magnetic memory devices capable of stably storing data.

Some example embodiments of the inventive concepts may also provide methods of fabricating a magnetic memory device, which are capable of reducing a defect.

In some example embodiments, a magnetic memory device may include a magnetic tunnel junction pattern on a substrate, the magnetic tunnel junction pattern including a free layer, a tunnel barrier layer and a pinned layer which are sequentially stacked, and a first spin-orbit torque (SOT) line in contact with a first sidewall of the free layer of the magnetic tunnel junction pattern.

In some example embodiments, a magnetic memory device may include a magnetic tunnel junction pattern on a substrate, the magnetic tunnel junction pattern including a free layer, a tunnel barrier layer and a pinned layer which are sequentially stacked, a first spin-orbit torque (SOT) line in contact with a first sidewall of the free layer, and a second spin-orbit torque (SOT) line in contact with a second sidewall of the free layer which is opposite to the first sidewall.

In some example embodiments, a magnetic memory device may include a magnetic tunnel junction pattern on a substrate, the magnetic tunnel junction pattern including a free layer, a tunnel barrier layer and a pinned layer which are sequentially stacked, a first spin-orbit torque (SOT) line in contact with at least one sidewall of the free layer.

In some example embodiments, a method of fabricating a magnetic memory device may include forming a preliminary magnetic tunnel junction pattern having a line shape extending in a first direction on a substrate, the preliminary magnetic tunnel junction pattern including a free layer, a tunnel barrier layer and a pinned layer which are sequentially stacked, forming an insulating structure covering a sidewall and a top surface of the preliminary magnetic tunnel junction pattern, removing a lower portion of the insulating structure to expose a sidewall of the free layer of the preliminary magnetic tunnel junction pattern, and forming a spin-orbit torque (SOT) line in contact with the sidewall of the free layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, some example embodiments of the inventive concepts will be described in more detail with reference to the accompanying drawings.

Figure 1:
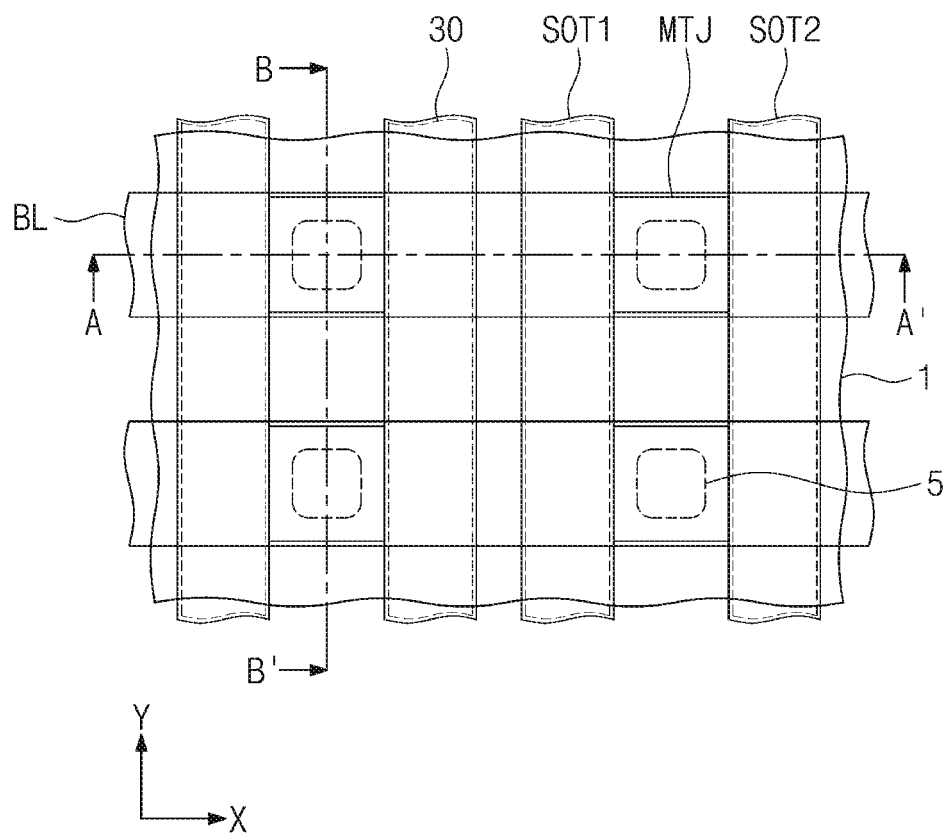
FIG. 1 is a plan view illustrating a magnetic memory device according to some example embodiments of the inventive concepts.
Figure 2:
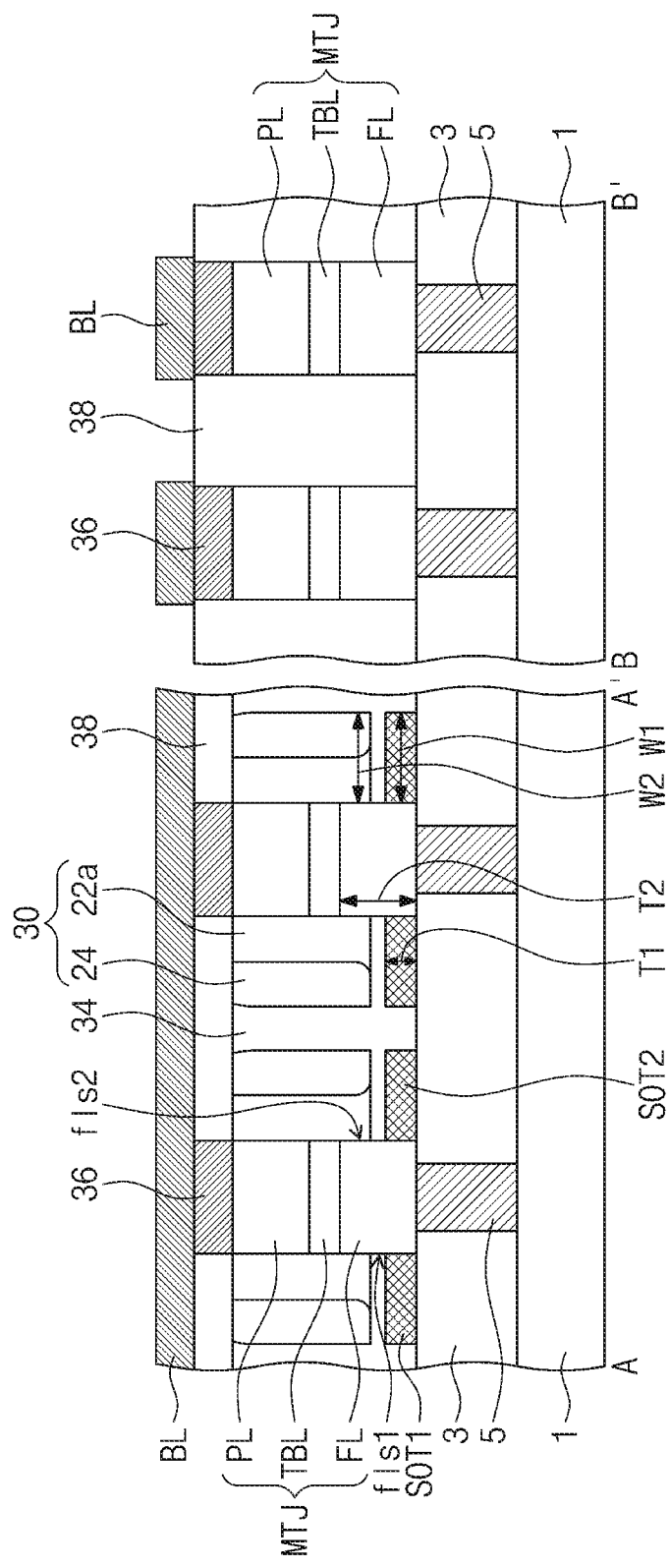
FIG. 2 is a cross-sectional view taken along lines A-A' and B-B' of FIG. 1 to illustrate a magnetic memory device according to some example embodiments of the inventive concepts.
Figure 3:
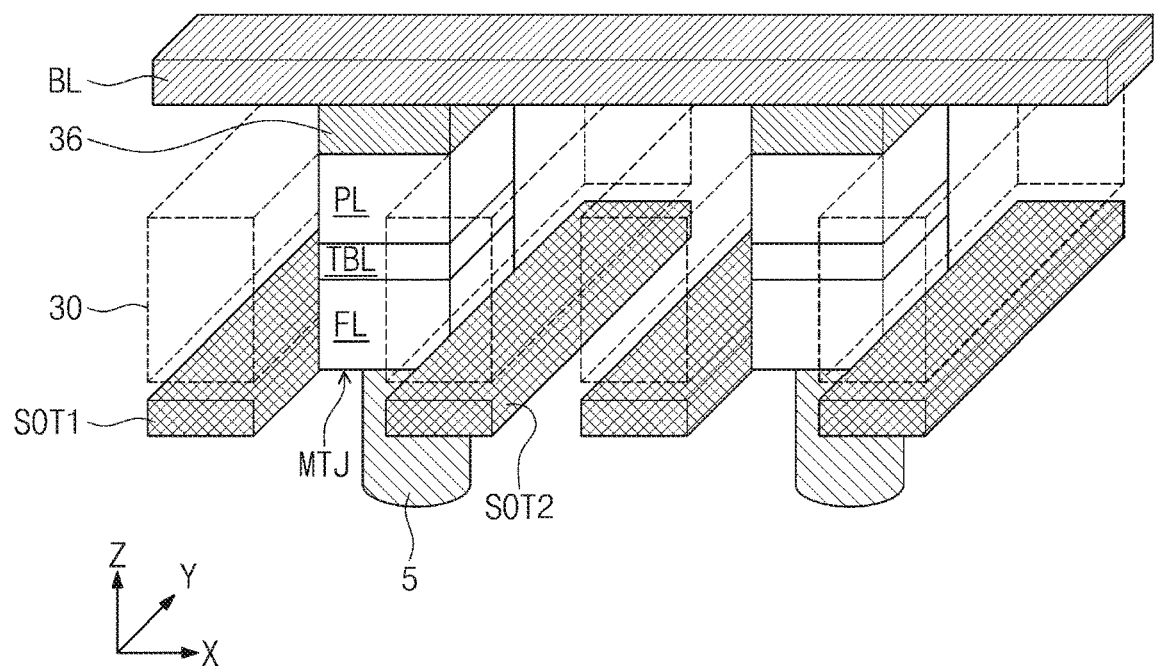
FIG. 3 is a perspective view illustrating a magnetic memory device according to some example embodiments of the inventive concepts.

FIG. 1 is a plan view illustrating a magnetic memory device according to some example embodiments of the inventive concepts. FIG. 2 is a cross-sectional view taken along lines A-A' and B-B' of FIG. 1 to illustrate a magnetic memory device according to some example embodiments of the inventive concepts. FIG. 3 is a perspective view illustrating a magnetic memory device according to some example embodiments of the inventive concepts.

Referring to FIGS. 1 to 3, a substrate 1 may be covered with an interlayer insulating layer 3. In some example embodiments, the substrate 1 may be a silicon wafer or a silicon-on-insulator (SOI) substrate. In some example embodiments, the substrate 1 may include at least one of silicon (Si), silicon-germanium (SiGe), germanium (Ge), and/or gallium-arsenic (GaAs). Even though not shown in the drawings, switching elements such as transistors and/or diodes may be disposed on the substrate 1. The interlayer insulating layer 3 may have a single-layered or multi-layered structure including at least one of a silicon oxide layer, a silicon nitride layer, and/or a silicon oxynitride layer. Contact plugs 5 may be disposed in the interlayer insulating layer 3. The contact plugs 5 may be electrically connected to the switching elements, respectively.

The contact plugs 5 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and/or a metal-semiconductor compound (e.g., a metal silicide). At least an upper portion of each of the contact plugs 5 may have an amorphous crystal structure. For example, the upper portion of each of the contact plugs 5 may include titanium nitride having an amorphous crystal structure.

Magnetic tunnel junction patterns MTJ may be disposed on the contact plugs 5, respectively. The magnetic tunnel junction patterns MTJ may be spaced apart from each other in a first direction X and a second direction Y. The second direction Y may intersect the first direction X. Each of the magnetic tunnel junction patterns MTJ may include a free layer FL, a tunnel barrier layer TBL and a pinned layer PL, which are sequentially stacked. The pinned layer PL may also be referred to as a reference layer. Planar shapes of the free layer FL, the tunnel barrier layer TBL and/or the pinned layer PL may be substantially the same as a planar shape of the magnetic tunnel junction pattern MTJ illustrated in FIG. 1.

The tunnel barrier layer TBL may include at least one of magnesium oxide (MgO), titanium oxide (TiO), aluminum oxide (AlO), magnesium-zinc oxide (MgZnO), magnesium-boron oxide (MgBO), titanium nitride (TiN), and/or vanadium nitride (VN).

Each of the pinned layer PL and the free layer FL may include at least one of a perpendicular magnetic material (e.g., CoFeTb, CoFeGd, and/or CoFeDy), a perpendicular magnetic material having a L10 structure, a CoPt alloy having a hexagonal close packed (HCP) lattice structure, and/or a perpendicular magnetic structure. The perpendicular magnetic material having the L10 structure may include at least one of FePt having the L10 structure, FePd having the L10 structure, CoPd having the L10 structure, and/or CoPt having the L10 structure.

The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where "n" denotes the number of bilayers. Here, the pinned layer PL may be thicker than the free layer FL, and/or a coercive force of the pinned layer PL may be greater than a coercive force of the free layer FL.

Electrode patterns 36 may be disposed on the magnetic tunnel junction patterns MTJ, respectively. For example, the electrode patterns 36 may include at least one of a metal (e.g., Ta, W, Ru, or Ir) and/or a conductive metal nitride (e.g., TiN).

The free layer FL of the magnetic tunnel junction pattern MTJ may have the planar shape of the magnetic tunnel junction pattern MTJ illustrated in FIG. 1. The free layer FL may include a first sidewall fls1 and a second sidewall fls2, which are opposite to each other in the first direction X. The first sidewall fls1 of the free layer FL may be in contact with a first spin-orbit torque (SOT) line SOT1. The second sidewall fls2 of the free layer FL may be in contact with a second spin-orbit torque (SOT) line SOT2. The first SOT line SOT1 and/or the second SOT line SOT2 may be spaced apart from each other and may have line shapes extending in the second direction Y.

Each of the first and second SOT lines SOT1 and SOT2 may have a first thickness T1. The free layer FL may have a second thickness T2 greater than the first thickness T1. The first SOT line SOT1 and/or the second SOT line SOT2 may be spaced apart from the contact plug 5. Bottom surfaces of the first and second SOT lines SOT1 and SOT2 may be substantially coplanar with a bottom surface of the magnetic tunnel junction pattern MTJ. The first SOT line SOT1 and/or the second SOT line SOT2 may be in contact with the interlayer insulating layer 3. The first SOT line SOT1 and/or the second SOT line SOT2 may be spaced apart from the tunnel barrier layer TBL.

If at least one of the first and second SOT lines SOT1 and SOT2 is in contact with the tunnel barrier layer TBL, the possibility of occurrence of a short between the free layer FL and the pinned layer PL may be increased and an error may occur in an operation of a magnetic memory device. However, according to some example embodiments of the inventive concepts, both the first SOT line SOT1 and the second SOT line SOT2 may be spaced apart from the tunnel barrier layer TBL, and thus occurrences of an electrical short may be reduced or prevented.

The first SOT line SOT1 and the second SOT line SOT2 may include at least one of a heavy metal and/or a material doped with a heavy metal. For example, the first SOT line SOT1 and the second SOT line SOT2 may include at least one of 'A', and/or 'M' doped with 'B'.

The 'A' may include yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta, including high-resistance amorphous β-Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), and/or any combination thereof.

The 'B' may include at least one of vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (I), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), and/or ytterbium (Yb).

The 'M' may include at least one of aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt), gold (Au), mercury (Hg), lead (Pb), silicon (Si), gallium (Ga), gallium-manganese (GaMn), and/or gallium-arsenic (GaAs).

The first SOT line SOT1 and/or the second SOT line SOT2 may include a non-magnetic metal material. Alternatively, the first SOT line SOT1 and/or the second SOT line SOT2 may include a topological insulator material. For example, the first SOT line SOT1 and/or the second SOT line SOT2 may include at least one of platinum (Pt), tungsten (W), tantalum (Ta), BiSb, and/or BiSe. The BiSb and BiSe may be referred to as topological insulator materials.

Upper portions of sidewalls, opposite to each other in the first direction X, of the magnetic tunnel junction pattern MTJ may be covered by spacers 30. The spacer 30 may be in contact with sidewalls of the pinned layer PL and/or the tunnel barrier layer TBL of the magnetic tunnel junction pattern MTJ. The spacer 30 may extend to be in contact with an upper portion of the free layer FL of the magnetic tunnel junction pattern MTJ. The spacers 30 may vertically overlap with the first and/or second SOT lines SOT1 and/or SOT2. The spacers 30 may be spaced apart from the first and/or second SOT lines SOT1 and/or SOT2. Each of top surfaces of the first and/or second SOT lines SOT1 and/or SOT2 may have a first width W1 in the first direction X. A bottom surface of the spacer 30 may have a second width W2 in the first direction X. The second width W2 may be substantially equal to the first width W1.

The spacer 30 may include a first sub-spacer 22a and/or a second sub-spacer 24, which include different materials. The first sub-spacer 22a may include, for example, silicon oxide, and the second sub-spacer 24 may include, for example, silicon nitride. A top surface of the spacer 30 may be flat. The top surface of the spacer 30 may be substantially coplanar with a top surface of the magnetic tunnel junction pattern MTJ. The spacer 30 may have a line shape extending in the second direction Y when viewed in a plan view. A sidewall of the spacer 30 may be vertically aligned with a sidewall of the first SOT line SOT1 and/or a sidewall of the second SOT line SOT2.

A first filling insulation layer 34 may fill a space between the spacers 30 spaced apart from each other in the first direction X. The first filling insulation layer 34 may be formed of an insulating material having excellent step coverage characteristics. For example, the first filling insulation layer 34 may be formed of a single layer or multi-layer including at least one of a spin-on-hardmask (SOH) layer, a silicon oxide layer, a silicon nitride layer, and/or a silicon oxynitride layer. The first filling insulation layer 34 may fill a space between the spacer 30 and the second SOT line SOT2. A top surface of the first filling insulation layer 34 may be substantially coplanar with the top surface of the spacer 30.

A second filling insulation layer 38 may fill a space between the magnetic tunnel junction patterns MTJ spaced apart from each other in the second direction Y. The second filling insulation layer 38 may be formed of an insulating material having excellent step coverage characteristics. For example, the second filling insulation layer 38 may be formed of a single layer or multi-layer including at least one of a spin-on-hardmask (SOH) layer, a silicon oxide layer, a silicon nitride layer, and/or a silicon oxynitride layer. The second filling insulation layer 38 may extend onto the first filling insulation layer 34 and/or the spacer 30 as illustrated in an A-A' cross sectional view of FIG. 2. The second filling insulation layer 38 may be in contact with sidewalls of the electrode patterns 36.

Bit lines BL may be disposed on the electrode patterns 36. Each of the bit lines BL may extend in the first direction X and may be electrically connected to the electrode patterns 36 arranged in the first direction X. For example, the bit lines BL may include at least one of a metal (e.g., Ta, W, Ru, and/or Ir) and/or a conductive metal nitride (e.g., TiN).

In some example embodiments, the electrode patterns 36 may be omitted, and the bit lines BL may be in direct contact with the top surfaces of the magnetic tunnel junction patterns MTJ.

Figure 4:
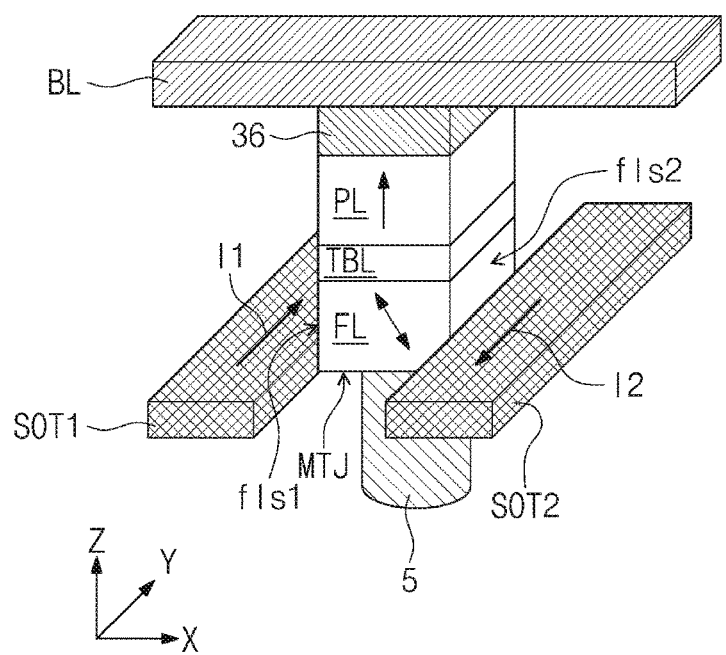
FIG. 4 is a perspective view illustrating a method of operating a magnetic memory device according to some example embodiments of the inventive concepts.

FIG. 4 is a perspective view illustrating a method of operating a magnetic memory device according to some example embodiments of the inventive concepts.

FIG. 4 illustrates a structure of a unit memory cell of the magnetic memory device described with reference to FIGS. 1 to 3. Referring to FIG. 4, the pinned layer PL may have a magnetization direction fixed in one direction (e.g., a vertical direction or a third direction Z). In a write operation of the magnetic memory device, the first SOT line SOT1 and/or the second SOT line SOT2 may apply spin-orbit torque to one magnetic tunnel junction pattern MTJ disposed therebetween. For example, a first current I1 may flow through the first SOT line SOT1, and/or a second current I2 may flow through the second SOT line SOT2. A flow direction of the first current I1 may be opposite to a flow direction of the second current I2.

The first and second currents I1 and I2 may be in-plane currents flowing through the first and second SOT lines SOT1 and SOT2. The first and second SOT lines SOT1 and SOT2 may have strong spin-orbit interaction. The first current I1 flowing through the first SOT line SOT1 may cause accumulation of spin-polarized charge carriers (e.g., electrons) on the first sidewall fls1 of the free layer FL by the spin-orbit interaction in the first SOT line SOT1. Likewise, the second current I2 flowing through the second SOT line SOT2 may cause accumulation of spin-polarized charge carriers (e.g., electrons) on the second sidewall fls2 of the free layer FL by the spin-orbit interaction in the second SOT line SOT2. A spin-orbit field may be generated by the accumulated charge carriers. The spin-orbit field may apply the spin-orbit torque to the free layer FL. Thus, a magnetization direction of the free layer FL may be switched using the spin-orbit torque.

In FIG. 4, the currents flow through both the first and second SOT lines SOT1 and SOT2 in the write operation. Alternatively, in the write operation, a current may flow through one of the first and second SOT lines SOT1 and SOT2, and the other of the first and second SOT lines SOT1 and SOT2 may be electrically floated.

In a read operation of the magnetic memory device, the first and/or second SOT lines SOT1 and/or SOT2 may be electrically floated. In other words, a voltage may not be applied to the first and/or second SOT lines SOT1 and/or SOT2. That is, a current may not flow through the first and/or second SOT lines SOT1 and/or SOT2. In the read operation, a read current may pass through the magnetic tunnel junction pattern MTJ in the vertical direction (e.g., the third direction Z) by using the bit line BL and the contact plug 5, thereby detecting a resistance state of the magnetic tunnel junction pattern MTJ.

The magnetic memory device according to some example embodiments may use the SOT lines SOT1 and/or SOT2 adjacent to the sidewalls of the magnetic tunnel junction pattern MTJ, and thus a spin-orbit torque magnetic memory device (e.g., SOT-MRAM) having a high degree of freedom of the write operation may be realized or provided. In addition, a current path in the write operation is different from a current path in the read operation in the magnetic memory device according to some example embodiments. Thus, the possibility that the magnetization direction of the free layer FL is switched in the read operation may be reduced or minimized, and thus stability of data storage may be improved or increased.

Figure 5:
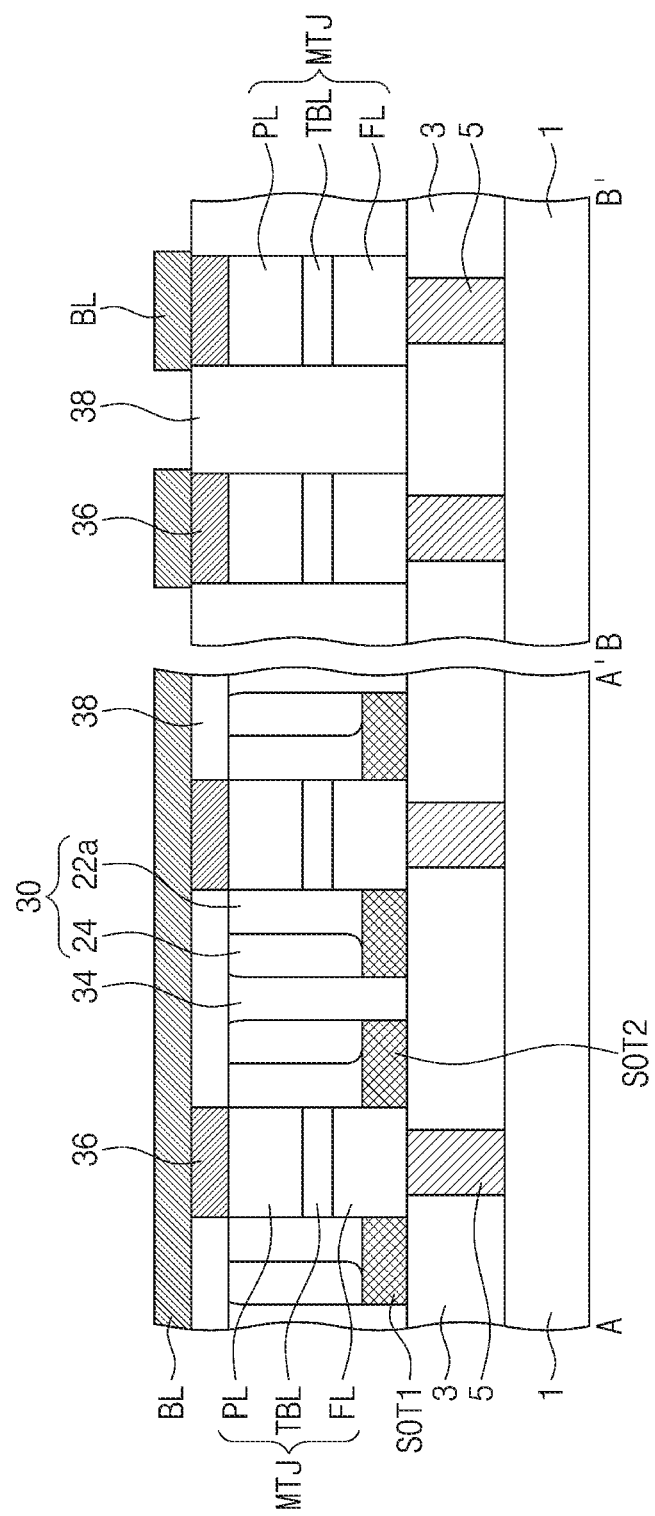
FIG. 5 is a cross-sectional view taken along the lines A-A' and B-B' of FIG. 1 to illustrate a magnetic memory device according to some example embodiments of the inventive concepts.

FIG. 5 is a cross-sectional view taken along the lines A-A' and B-B' of FIG. 1 to illustrate a magnetic memory device according to some example embodiments of the inventive concepts.

Referring to FIG. 5, in a magnetic memory device according to some example embodiments, a spacer 30 covering one sidewall of the magnetic tunnel junction pattern MTJ may be in contact with the first SOT line SOT1. In addition, a spacer 30 covering another sidewall of the magnetic tunnel junction pattern MTJ may be in contact with the second SOT line SOT2. A first filling insulation layer 34 may not be disposed between the first SOT line SOT1 and the spacer 30 and/or between the second SOT line SOT2 and the spacer 30. Other structures and operations of the magnetic memory device according to some example embodiments may be the same or similar as described with reference to FIGS. 1 to 4.

FIGS. 6, 8, 10, 15, 19 and 21 are plan views illustrating a method of fabricating the magnetic memory device of FIG. 1, according to some example embodiments of the inventive concepts. FIGS. 7, 9, 11, 12, 13, 14, 16, 17, 18, 20, 22a and 22b are cross-sectional views illustrating a method of fabricating the magnetic memory device of FIG. 2, according to some example embodiments of the inventive concepts.

Figure 6:
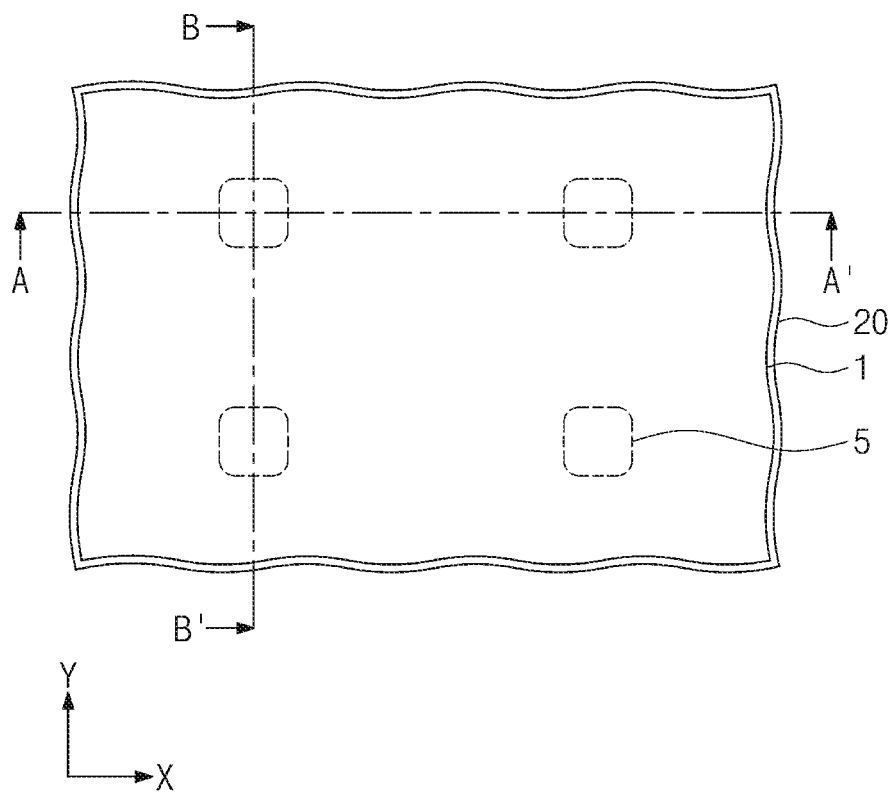
FIGS. 6, 8, 10, 15, 19 and 21 are plan views illustrating a method of fabricating the magnetic memory device of FIG. 1, according to some example embodiments of the inventive concepts.
Figure 7:
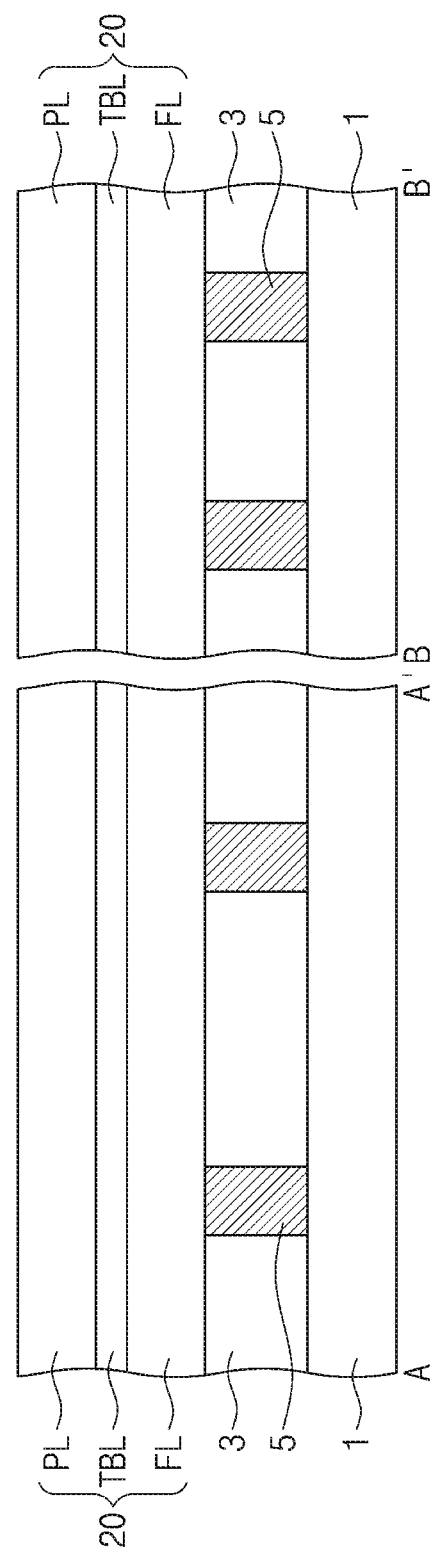
FIGS. 7, 9, 11, 12, 13, 14, 16, 17, 18, 20, 22a and 22b are cross-sectional views illustrating a method of fabricating the magnetic memory device of FIG. 2, according to some example embodiments of the inventive concepts.

Referring to FIGS. 6 and 7, a substrate 1 may be prepared. Even though not shown in the drawings, switching elements such as transistors and/or diodes may be formed on the substrate 1. For example, the substrate 1 may be a silicon wafer or a silicon-on-insulator (SOI) substrate. An interlayer insulating layer 3 may be formed on the substrate 1 by a deposition process. The interlayer insulating layer 3 may be formed of a single layer or multi-layer including at least one of, for example, a silicon oxide layer, a silicon nitride layer, and/or a silicon oxynitride layer. The interlayer insulating layer 3 may be patterned to form contact holes, a conductive layer may be formed to fill the contact holes, and a polishing process or an etch-back process may be performed on the conductive layer to form contact plugs 5 in the contact holes, respectively. At least an upper portion of each of the contact plugs 5 may be formed to have an amorphous crystal structure. For example, the contact plugs 5 may be formed of titanium nitride having an amorphous crystal structure. Alternatively, the contact plugs 5 may have substantially the same or similar crystal structure as a free layer FL to be formed.

Deposition processes may be performed to sequentially form a free layer FL, a tunnel barrier layer TBL and/or a pinned layer PL on an entire top surface of the interlayer insulating layer 3. The free layer FL, the tunnel barrier layer TBL and/or the pinned layer PL may constitute a magnetic tunnel junction structure 20. Kinds and/or materials of the free layer FL, the tunnel barrier layer TBL and/or the pinned layer PL may be the same as described above.

In some example embodiments, an annealing process may be performed after the formation of the free layer FL, the tunnel barrier layer TBL and/or the pinned layer PL. Thus, the free layer FL and/or the pinned layer PL may be crystallized. At this time, since at least the upper portions of the contact plugs 5 have the amorphous crystal structure, the free layer FL and/or the pinned layer PL may have desired crystal structures without the influence of the crystal structure of the contact plugs 5. A magnetic field process may be additionally performed in addition to the annealing process. In some example embodiments, the annealing process and/or the magnetic field process may be performed after formation of magnetic tunnel junction patterns MTJ to be described later (see FIGS. 21, 22A and 22B).

Figure 8:
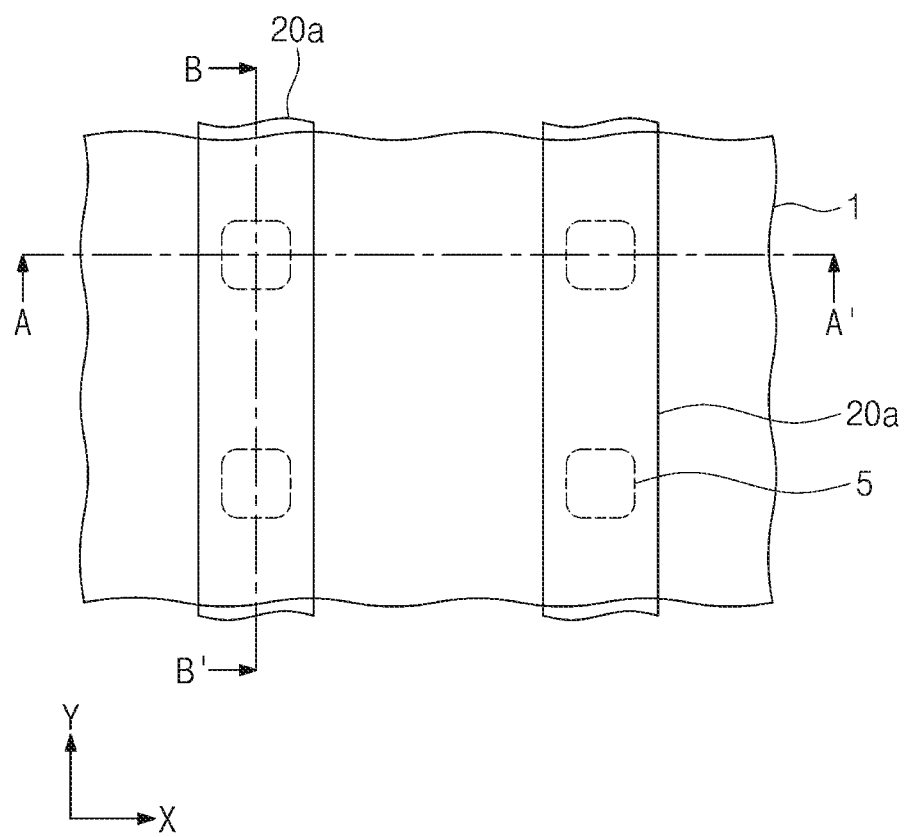
Figure 9:
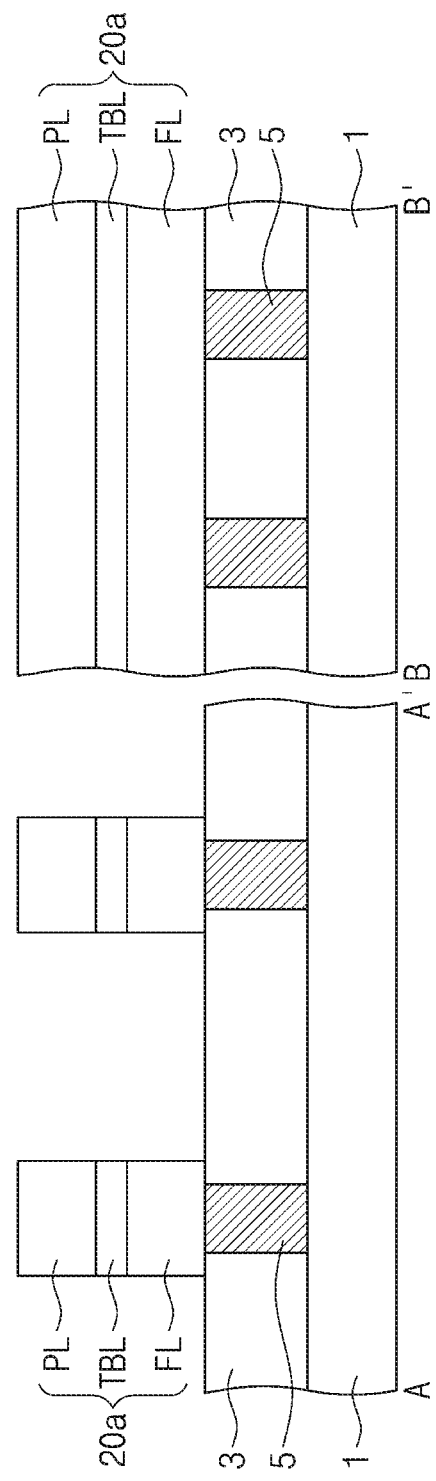

Referring to FIGS. 8 and 9, the magnetic tunnel junction structure 20 may be line-etched to form preliminary magnetic tunnel junction patterns 20a. The preliminary magnetic tunnel junction patterns 20a may have line shapes extending in the second direction Y. Each of the preliminary magnetic tunnel junction patterns 20a may be in contact with the contact plugs 5 arranged in the second direction Y. In some example embodiments, the preliminary magnetic tunnel junction patterns 20a may have widths greater than those of the contact plugs 5 and/or may cover entire top surfaces of the contact plugs 5, and thus occurrences of an electrical short may be reduced or prevented. The contact plugs 5 may not be exposed in the etching process for forming the preliminary magnetic tunnel junction patterns 20a. If the contact plugs 5 are exposed in the etching process, upper portions of the contact plugs 5 may be partially etched, and an etched conductive material of the contact plugs 5 may be re-deposited on sidewalls of the preliminary magnetic tunnel junction patterns 20a to cause an electrical short between the free layer FL and the pinned layer PL. In this case, an error may occur in an operation of a magnetic memory device. However, according to some example embodiments of the inventive concepts, the contact plugs 5 may not be exposed in the etching process, and thus this problem may be reduced or solved. As a result, process defects may be reduced or prevented.

Figure 10:
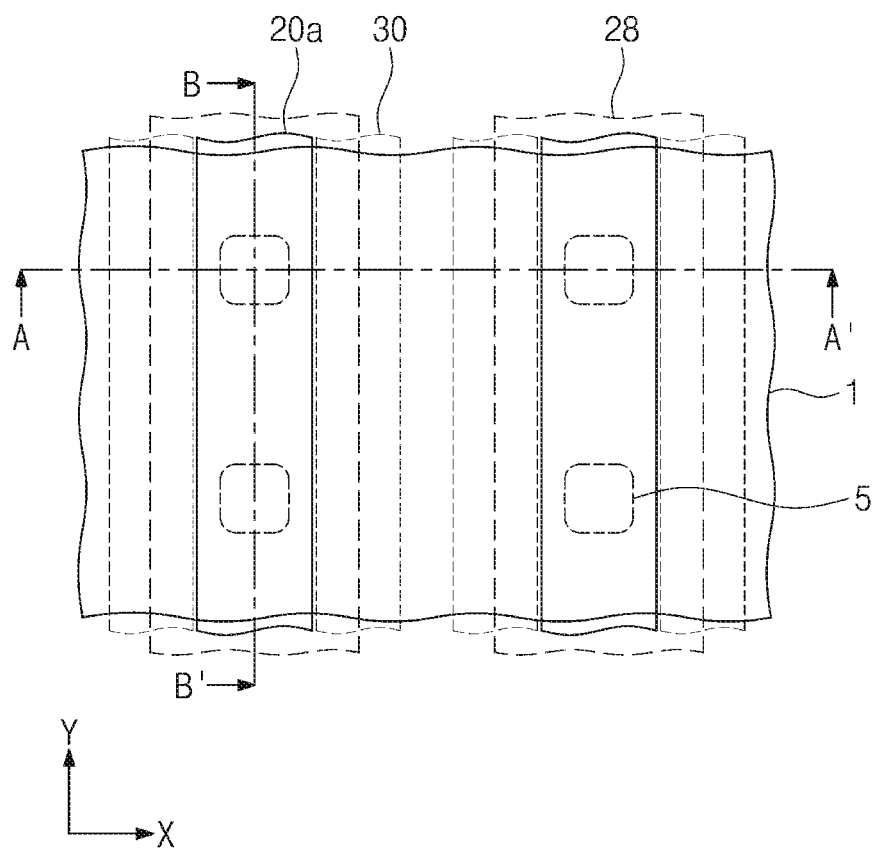
Figure 11:
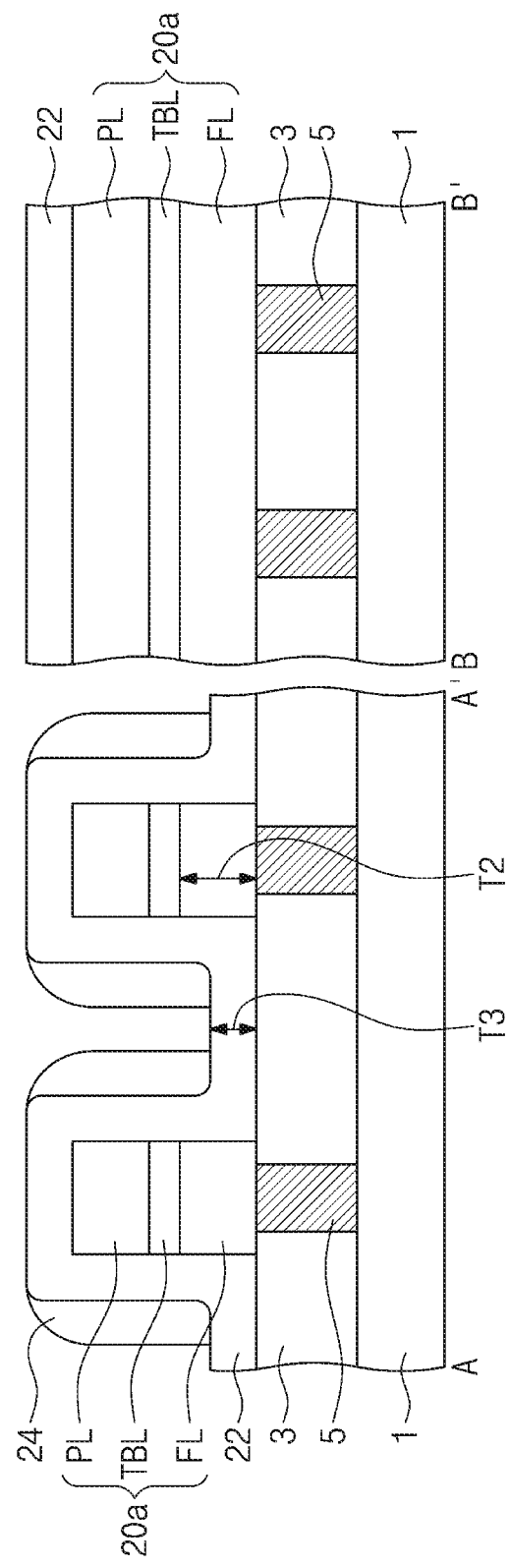

Referring to FIGS. 10 and 11, a deposition process may be performed on the substrate 1 having the preliminary magnetic tunnel junction patterns 20a to conformally form a first sub-spacer layer 22 on an entire top surface of the substrate 1. For example, the first sub-spacer layer 22 may be formed of a silicon oxide layer, a silicon nitride layer, and/or a silicon oxynitride layer. The line-etching process and the deposition process may be performed in-situ in one process chamber or one process apparatus. The first sub-spacer layer 22 may encapsulate top surfaces and sidewalls of the preliminary magnetic tunnel junction patterns 20a to prevent oxygen outside the process chamber from coming in contact with the preliminary magnetic tunnel junction patterns 20a. As a result, damage (e.g., oxidation) of the preliminary magnetic tunnel junction patterns 20a may be reduced or prevented, and thus reliability of a magnetic memory device finally fabricated may be improved.

The first sub-spacer layer 22 may have a third thickness T3. The third thickness T3 may be less than a second thickness T2 of the free layer FL. A deposition process and an anisotropic etching process may be performed to form second sub-spacers 24 covering sidewalls of the first sub-spacer layer 22. The second sub-spacers 24 may be formed of a material having an etch selectivity with respect to the first sub-spacer layer 22. The second sub-spacers 24 may be formed of a different material from that of the first sub-spacer layer 22. For example, the second sub-spacers 24 may be formed of silicon oxide, silicon nitride, and/or silicon oxynitride. For example, when the first sub-spacer layer 22 is formed of silicon oxide, the second sub-spacers 24 may be formed of silicon nitride. The second sub-spacer 24 may be formed to have a thickness capable of preventing the second sub-spacers 24 adjacent to each other from being in contact with each other. A portion of a top surface of the first sub-spacer layer 22 may be exposed by the second sub-spacers 24 between the preliminary magnetic tunnel junction patterns 20a adjacent to each other in the first direction X. In addition, a top surface of the first sub-spacer layer 22 on the preliminary magnetic tunnel junction patterns 20a may also be exposed.

Figure 12:
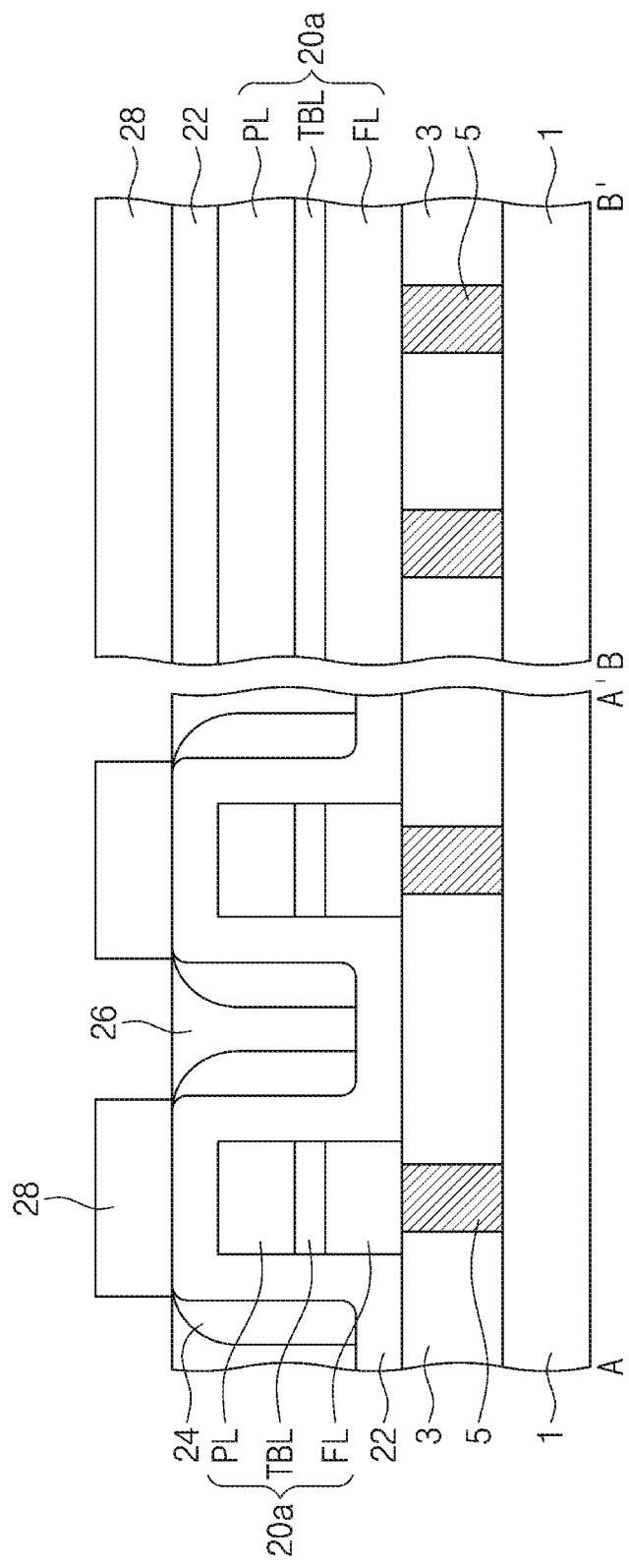

Referring to FIGS. 10 and 12, a sacrificial layer 26 may be formed to fill a space between the second sub-spacers 24 adjacent to each other in the first direction X. The sacrificial layer 26 may be formed of a material having an etch selectivity with respect to both the first sub-spacer layer 22 and the second sub-spacer 24. The sacrificial layer 26 may be formed of a spin-on-hardmask (SOH) layer and/or spin-on-carbon (SOC) layer having excellent step coverage characteristics. The sacrificial layer 26 may be formed through a spin-coating process and a polishing process (or an etch-back process). A top surface of the sacrificial layer 26 may be substantially coplanar with the top surface of the first sub-spacer layer 22 disposed on the preliminary magnetic tunnel junction patterns 20a. A first mask pattern 28 may be formed to cover the first sub-spacer layer 22 disposed on each of the preliminary magnetic tunnel junction patterns 20a. The first mask pattern 28 may be formed of a material having an etch selectivity with respect to the sacrificial layer 26. For example, the first mask pattern 28 may include the same material as the second sub-spacer 24. The first mask pattern 28 may be formed by etching a mask layer using a photoresist pattern formed through a photolithography process. At this time, a height difference may be eliminated by the sacrificial layer 26, and thus the photoresist pattern may be accurately formed. As a result, the first mask pattern 28 may also be accurately formed. The first mask pattern 28 may have a line shape extending in the second direction Y when viewed in a plan view. The first sub-spacer layer 22 disposed on the preliminary magnetic tunnel junction patterns 20a may not be exposed, due to the first mask patterns 28.

Figure 13:
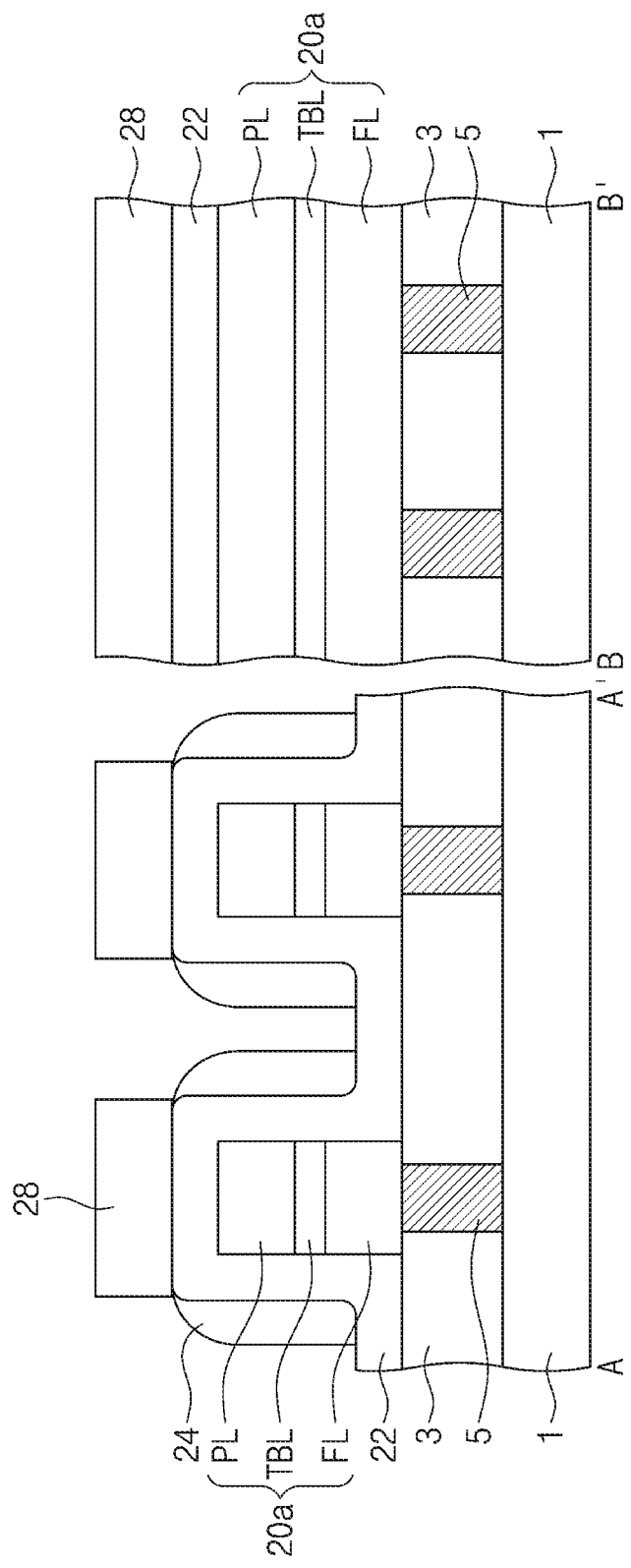

Referring to FIGS. 10 and 13, after the formation of the first mask pattern 28, the sacrificial layer 26 may be removed to expose the first sub-spacer layer 22 between the second sub-spacers 24. The first mask pattern 28, the first sub-spacer layer 22 and the second sub-spacers 24 may constitute an insulating structure.

Figure 14:
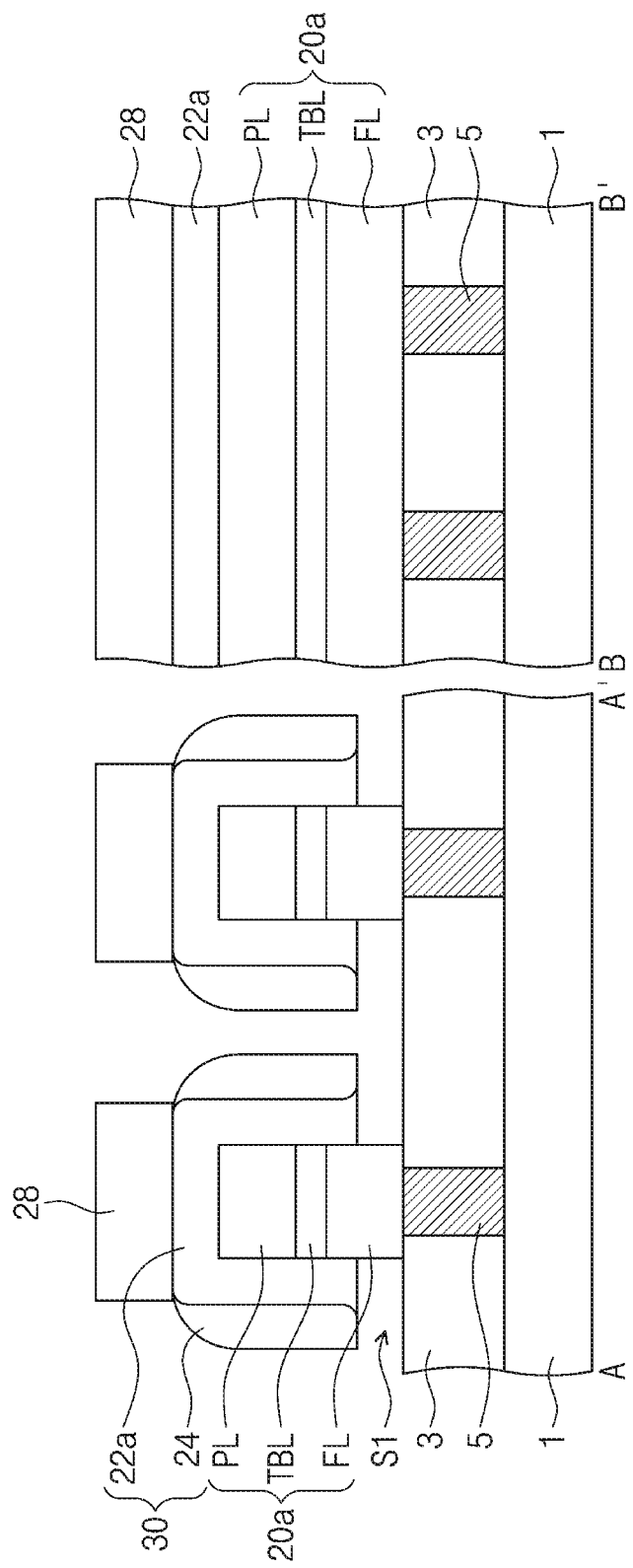

Referring to FIGS. 10 and 14, an etching process may be performed using the first mask pattern 28 and the second sub-spacers 24 as etch masks to remove the first sub-spacer layer 22 exposed between the second sub-spacers 24. In addition, portions of the first sub-spacer layer 22 disposed under the second sub-spacers 24 may be removed to form first spaces S1 exposing sidewalls of the free layers FL of the preliminary magnetic tunnel junction patterns 20a. Thus, a first sub-spacer 22a may be formed. The first sub-spacer 22a and the second sub-spacer 24 may constitute a spacer 30. The etching process may be an isotropic etching process. Alternatively, the etching process may include an anisotropic etching process and an isotropic etching process which are sequentially performed. Since the first space S1 is formed by the isotropic etching process, etch damage of the sidewall of the free layer FL may be reduced or prevented. When the first sub-spacer layer 22 is formed of a silicon oxide layer, the isotropic etching process may be, for example, a wet etching process using LAL.

Figure 15:
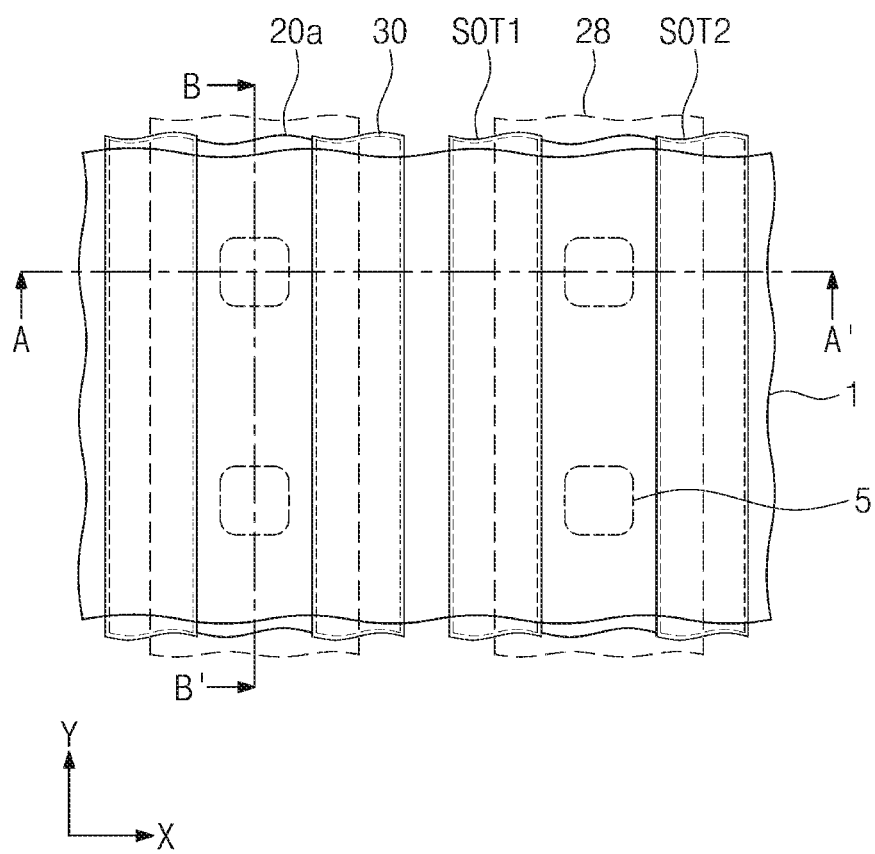
Figure 16:
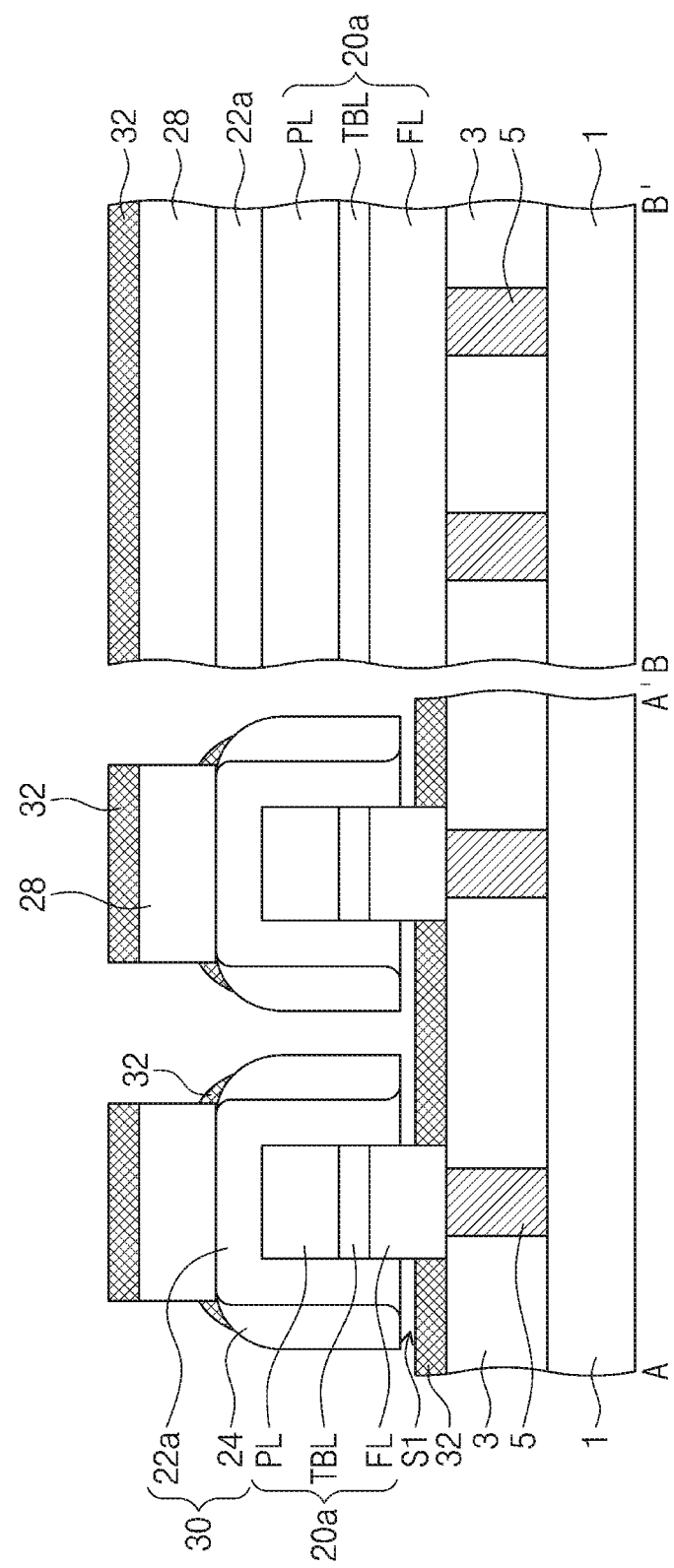

Referring to FIGS. 15 and 16, a spin-orbit torque (SOT) layer 32 may be stacked on an entire top surface of the substrate 1 having the first space S1. The SOT layer 32 may be formed by, for example, a chemical vapor deposition (CVD) process. At this time, the SOT layer 32 may be discontinuously formed. The SOT layer 32 may be in contact with the interlayer insulating layer 3 between the preliminary magnetic tunnel junction patterns 20a adjacent to each other. In addition, the SOT layer 32 may be in contact with the sidewall of the free layer FL in the first space S1. The SOT layer 32 may be spaced apart from bottom surfaces of the first and second sub-spacers 22a and 24. The SOT layer 32 may cover a top surface of the first mask pattern 28. Furthermore, the SOT layer 32 may be partially formed on the second sub-spacer 24. The SOT layer 32 may have the first thickness T1 shown in FIG. 2.

When the SOT layer 32 is formed by the CVD process, the SOT layer 32 may be discontinuously formed, and thus first and second SOT lines SOT1 and SOT2 to be finally formed may be spaced apart from the spacers 30, as illustrated in FIG. 2. Alternatively, when the SOT layer 32 is formed by an atomic layer deposition (ALD) process, the SOT layer 32 may be conformally formed to fill the first spaces S1. In this case, first and second SOT lines SOT1 and SOT2 to be finally formed may be in contact with the spacers 30, as illustrated in FIG. 5.

Figure 17:
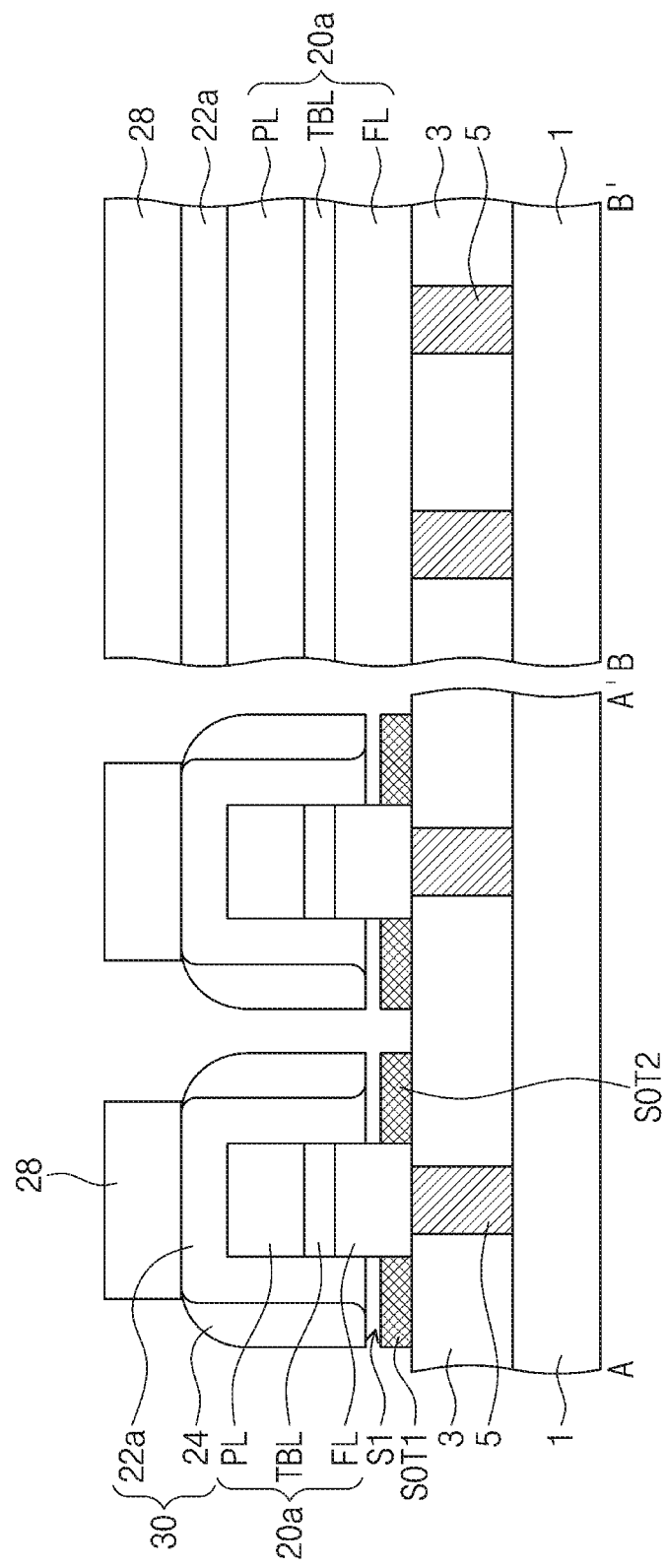

Referring to FIGS. 15 and 17, a blanket etch-back process may be performed to remove the SOT layer 32 on the first mask pattern 28 and the second sub-spacer 24 and to remove the SOT layer 32 between the second sub-spacers 24 adjacent to each other. Thus, a first SOT line SOT1 and a second SOT line SOT2 separated from each other may be formed and a portion of the top surface of the interlayer insulating layer 3 may be exposed.

Figure 18:
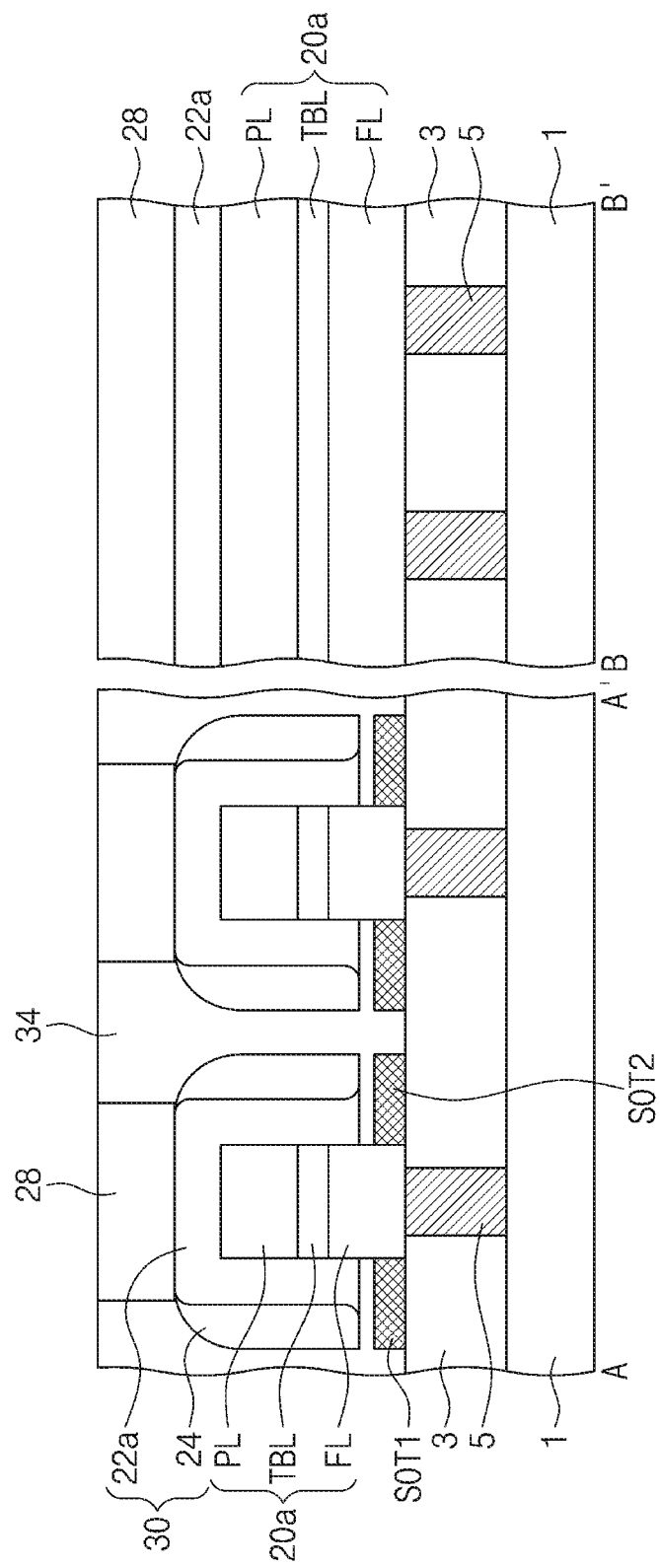

Referring to FIGS. 15 and 18, a first filling insulation layer 34 may be formed to fill a space between the spacers 30 adjacent to each other, between the first mask patterns 28 adjacent to each other, and/or between the spacers 30 and the first and second SOT lines SOT1 and SOT2. The first filling insulation layer 34 may be formed by performing a spin-coating process (or a deposition process) and a polishing process (or an etch-back process).

Figure 19:
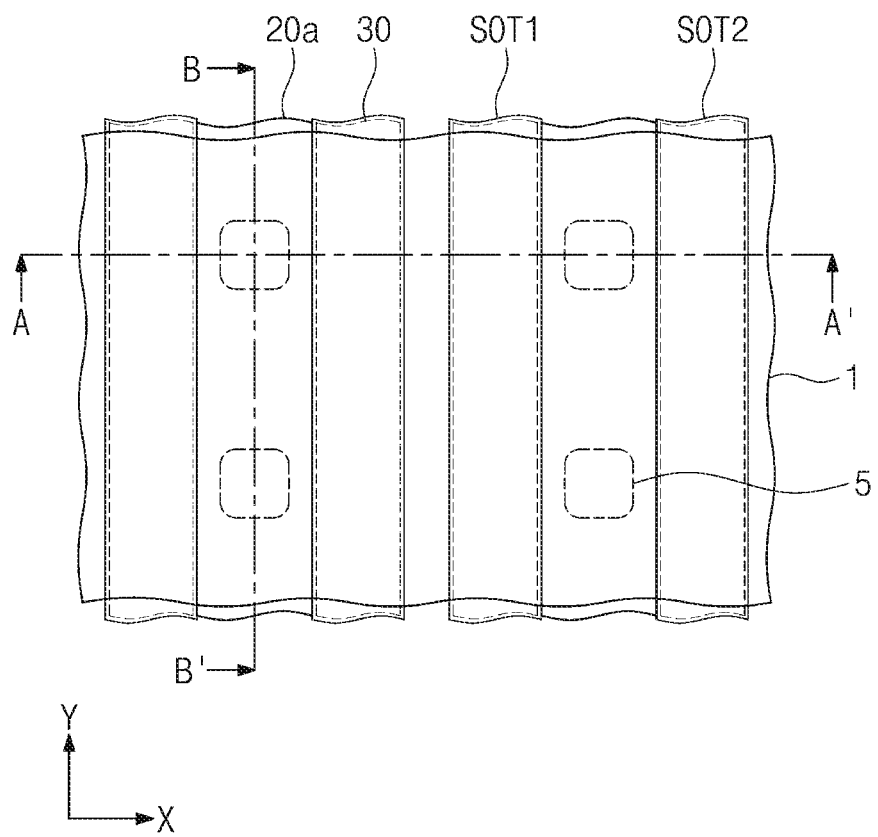
Figure 20:
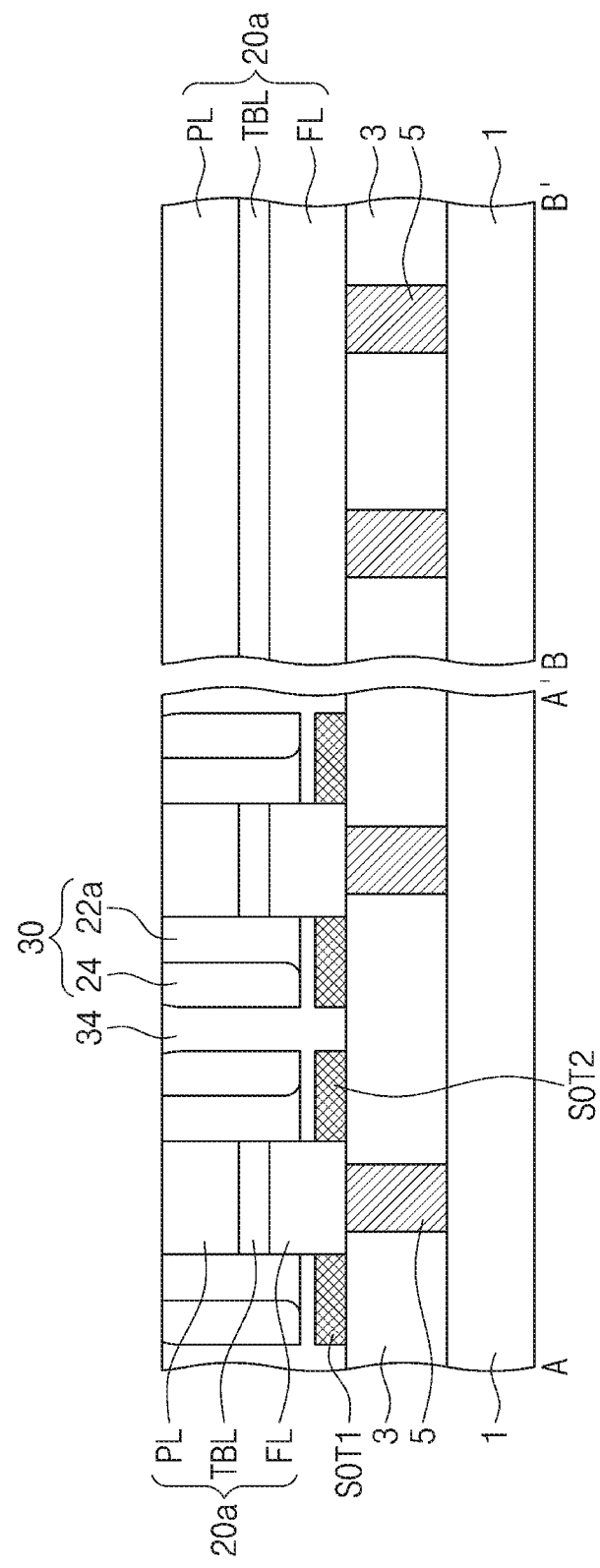

Referring to FIGS. 19 and 20, a polishing process may be performed to remove the first mask patterns 28, portions of the spacers 30, and/or a portion of the first filling insulation layer 34. At this time, the portions of the spacers 30 and/or the portion of the first filling insulation layer 34 which are removed may be located higher than top surfaces of the preliminary magnetic tunnel junction patterns 20a, and thus the top surfaces of the preliminary magnetic tunnel junction patterns 20a may be exposed.

Figure 21:
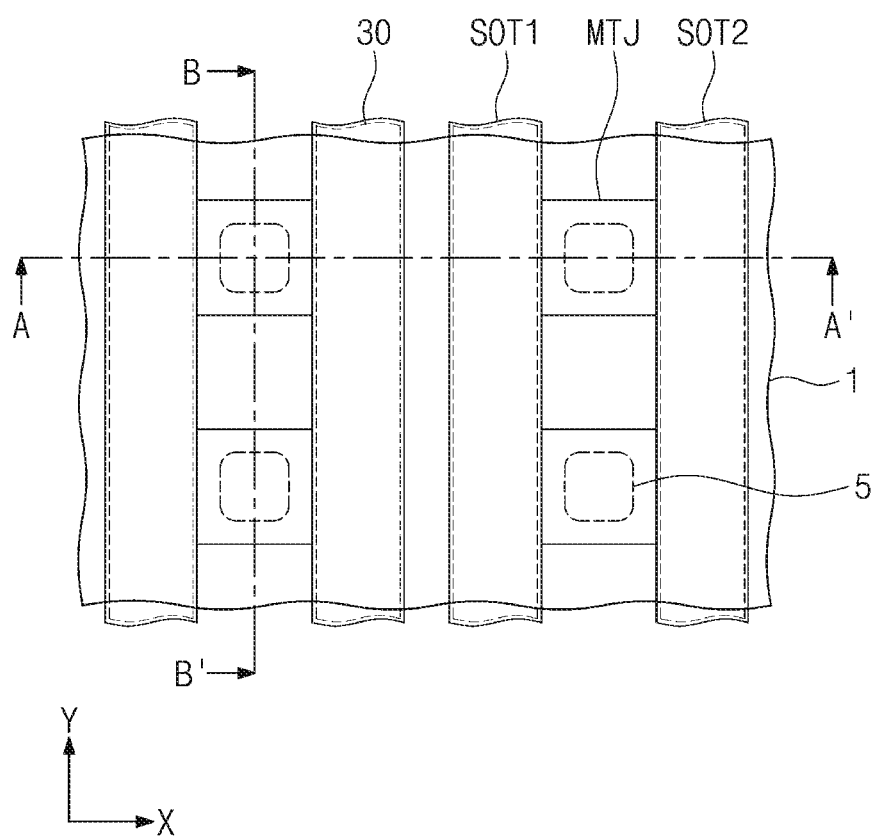
Figure 22A:
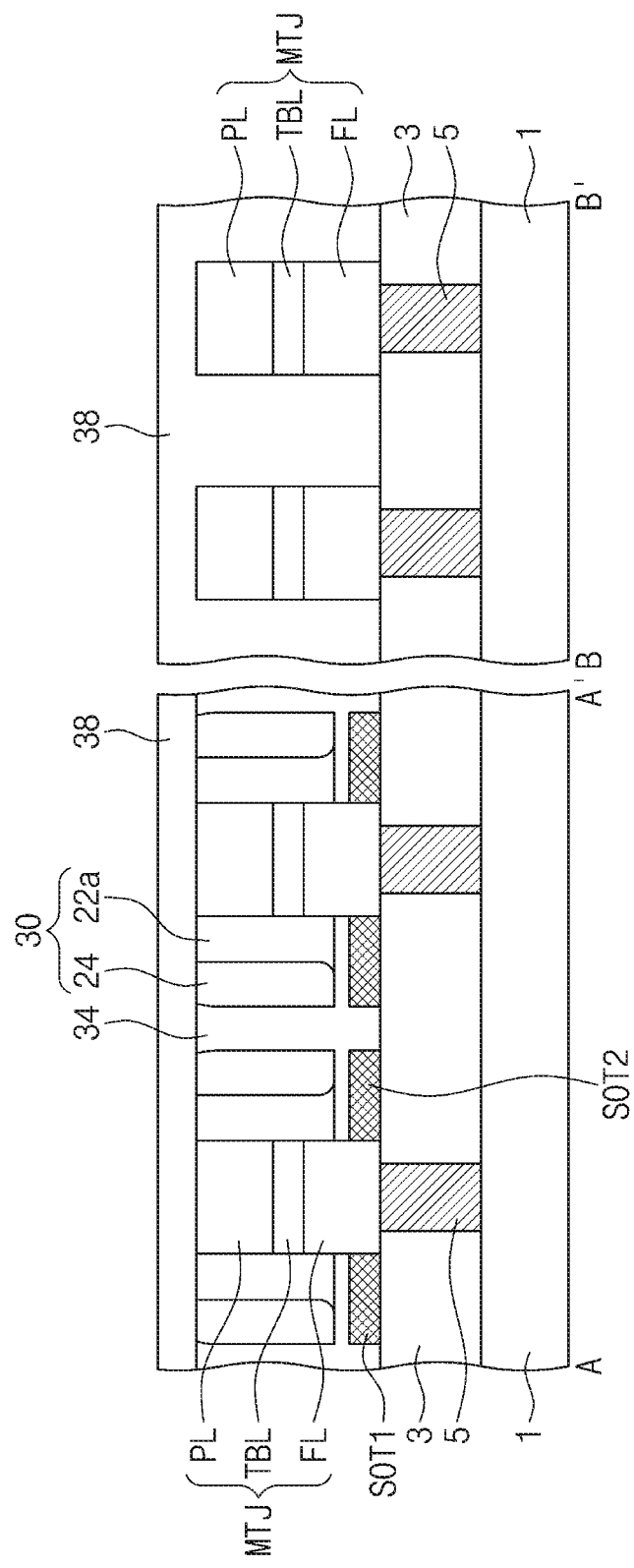

Referring to FIGS. 21 and 22a, the preliminary magnetic tunnel junction patterns 20a may be etched using mask patterns (not shown) as etch masks to form magnetic tunnel junction patterns MTJ. At this time, the mask pattern (not shown) may have a single-layered or multi-layered structure including at least one of an oxide layer, a nitride layer, an oxynitride layer, a carbide layer, and/or a diamond like carbon (DLC) layer. In the etching process, the interlayer insulating layer 3 may be exposed between the magnetic tunnel junction patterns MTJ arranged in the second direction Y. A thermal treatment process may be performed after the etching process. The thermal treatment process may be performed at a temperature of, for example, about 200 degrees Celsius. Atoms in a metal oxide layer of the tunnel barrier layer TBL may be rearranged and crystallized by the thermal treatment process. Thereafter, a second filling insulation layer 38 may be formed to fill a space between the magnetic tunnel junction patterns MTJ. The second filling insulation layer 38 may cover the top surfaces of the magnetic tunnel junction patterns MTJ and top surfaces of the spacers 30.

Subsequently, referring to FIGS. 1 to 3, the second filling insulation layer 38 may be patterned to form openings exposing the magnetic tunnel junction patterns MTJ. Electrode patterns 36 being in contact with the magnetic tunnel junction patterns MTJ may be formed by filling the openings with a conductive material. A conductive layer may be formed and then may be patterned to form bit lines BL which are in contact with the electrode patterns 36. The electrode patterns 36 and the bit lines BL may be formed at the same time or may be formed by different processes. In some example embodiments, the process of forming the electrode patterns 36 may be omitted, and the bit lines BL may be in direct contact with the magnetic tunnel junction patterns MTJ.

Figure 22B:
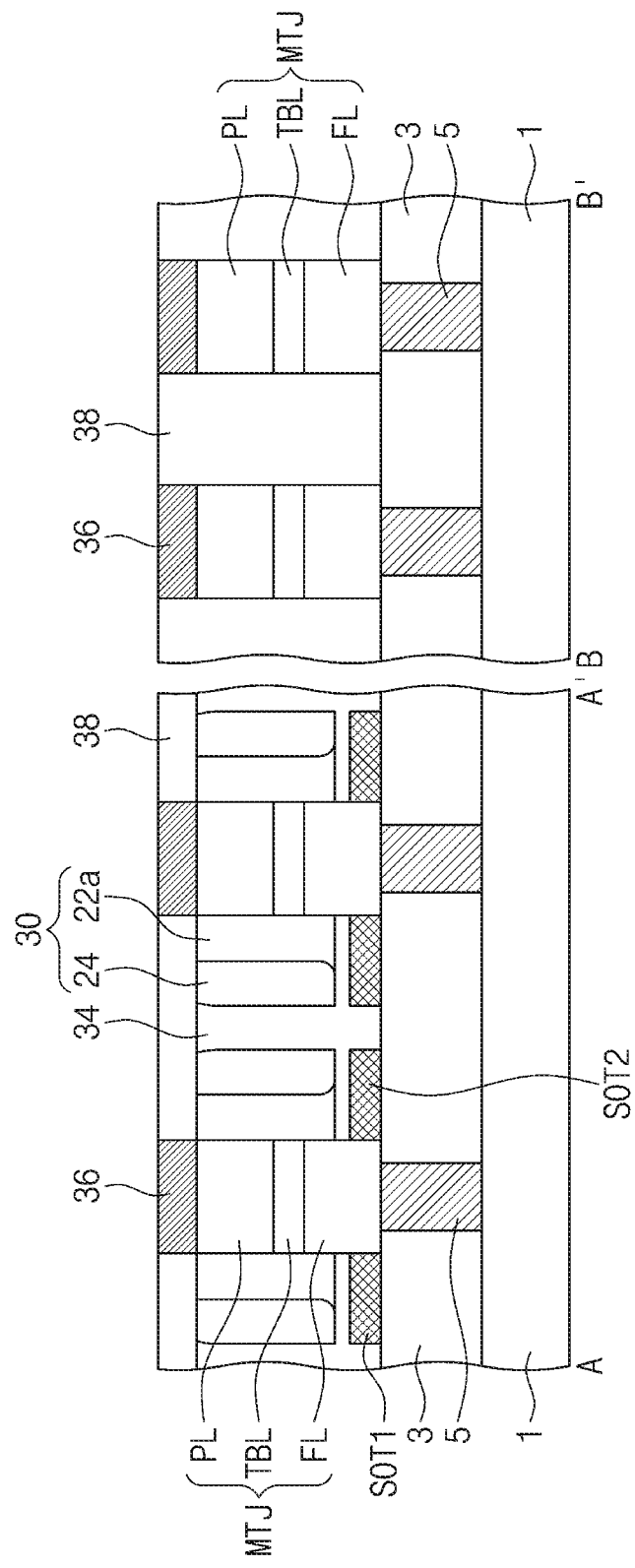

Alternatively, referring to FIGS. 21 and 22B, electrode patterns 36 may be formed on the preliminary magnetic tunnel junction patterns 20a. The electrode patterns 36 may have island shapes spaced apart from each other in the first direction X and the second direction Y. The preliminary magnetic tunnel junction patterns 20a may be etched using the electrode patterns 36 as etch masks to form magnetic tunnel junction patterns MTJ which have island shapes and are spaced apart from each other. In the etching process, the interlayer insulating layer 3 may be exposed between the magnetic tunnel junction patterns MTJ arranged in the second direction Y.

A second filling insulation layer 38 may be formed to fill a space between the magnetic tunnel junction patterns MTJ spaced apart from each other in the second direction Y. The second filling insulation layer 38 may cover top surfaces of the first filling insulation layer 34 and the spacers 30 in an A-A' cross-sectional view of FIG. 22B. A polishing process or an etch-back process may be performed on the second filling insulation layer 38 to expose the electrode patterns 36.

Subsequently, referring to FIGS. 1 to 3, a conductive layer may be deposited and then may be patterned to form bit lines BL which are in contact with the electrode patterns 36.

If the SOT lines SOT1 and SOT2 are disposed under the magnetic tunnel junction patterns MTJ, in the process of etching the preliminary magnetic tunnel junction patterns 20a to form the magnetic tunnel junction patterns MTJ, etch damage of upper portions of the SOT lines SOT1 and SOT2 may be caused to deteriorate reliability of the SOT lines SOT1 and SOT2, and/or a conductive material of the SOT lines SOT1 and SOT2 may be re-deposited on sidewalls of the magnetic tunnel junction patterns MTJ to cause an electrical short between the free layer FL and the pinned layer PL. In this case, an error may occur in an operation of a magnetic memory device. However, according to some example embodiments of the inventive concepts, the SOT lines SOT1 and SOT2 may be formed at sides of the magnetic tunnel junction patterns MTJ, and thus these problems may be reduced or prevented. As a result, the magnetic memory device with improved reliability may be fabricated.

Figure 23:
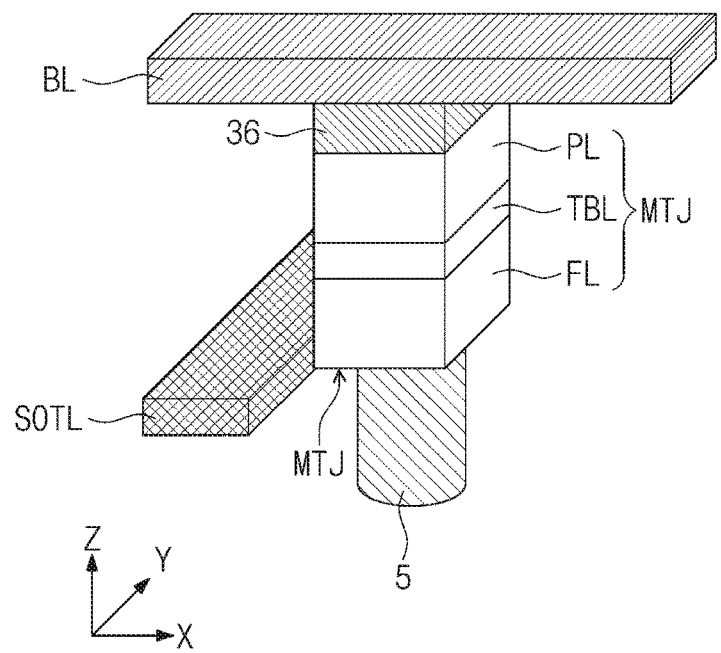
FIGS. 23 to 25 are perspective views illustrating magnetic memory devices according to some example embodiments of the inventive concepts.
Figure 24:
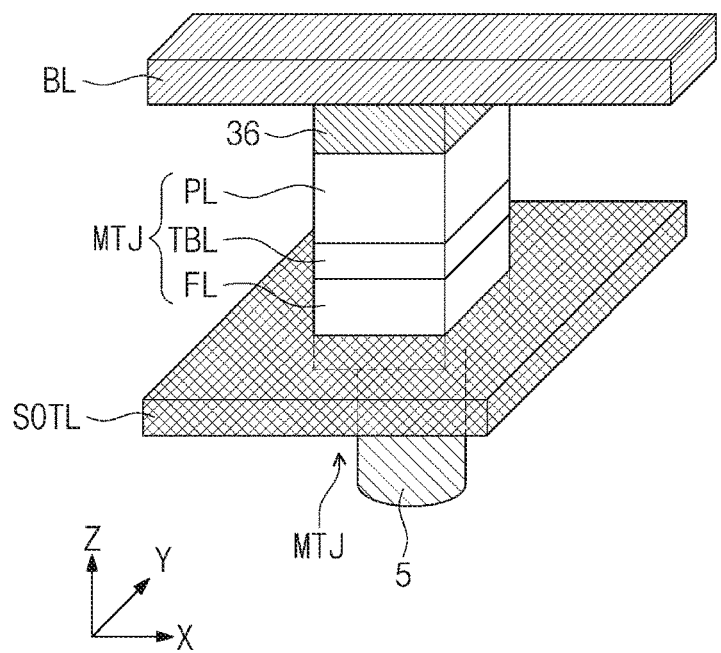
Figure 25:
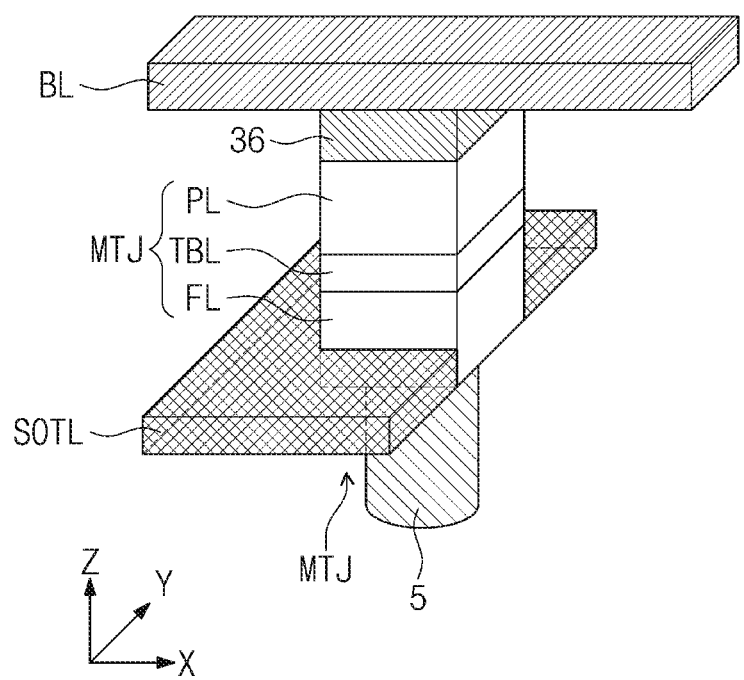

FIGS. 23 to 25 are perspective views illustrating magnetic memory devices according to some example embodiments of the inventive concepts.

Referring to FIG. 23, a magnetic memory device according to some example embodiments may include one SOT line SOTL which is in contact with one sidewall of the free layer FL of the magnetic tunnel junction pattern MTJ. The SOT line SOTL may not be disposed on another sidewall of the free layer FL of the magnetic tunnel junction pattern MTJ. Three sidewalls of the free layer FL may not be in contact with the SOT line SOTL. Other structures and/or an operating method of the magnetic memory device according to some example embodiments may be the same or similar as described with reference to FIGS. 1 to 4.

Referring to FIG. 24, in a magnetic memory device according to some example embodiments, one SOT line SOTL may be in contact with four sidewalls of the free layer FL of the magnetic tunnel junction pattern MTJ. The SOT line SOTL may have a line shape extending in the second direction Y. The SOT line SOTL may be spaced apart from both the tunnel barrier layer TBL and the contact plug 5. Other structures and/or an operating method of the magnetic memory device according to some example embodiments may be the same or similar as described with reference to FIGS. 1 to 4.

Referring to FIG. 25, in a magnetic memory device according to some example embodiments, one SOT line SOTL may be in contact with three sidewalls of the free layer FL of the magnetic tunnel junction pattern MTJ. A remaining one sidewall of the free layer FL may not be in contact with the SOT line SOTL. The SOT line SOTL may have a line shape extending in the second direction Y. The SOT line SOTL may be spaced apart from both the tunnel barrier layer TBL and the contact plug 5. Other structures and/or an operating method of the magnetic memory device according to some example embodiments may be the same or similar as described with reference to FIGS. 1 to 4.

In the magnetic memory device according to some example embodiments of the inventive concepts, the flow direction of the current in the write operation may be different from the flow direction of the current in the read operation. Thus, data may be stably stored.

In addition, the SOT line may be disposed on the sidewall of the free layer in the magnetic memory device, and thus the degree of freedom of the write operation may be improved and occurrences of an electrical short may be reduced or prevented. As a result, the reliability of the magnetic memory device may be improved.

In the method of fabricating the magnetic memory device according to some example embodiments of the inventive concepts, the SOT line may be formed on the sidewall of the preliminary magnetic tunnel junction pattern having the line shape, and then, the preliminary magnetic tunnel junction pattern may be etched. Thus, process defects may be reduced or prevented.

Figure 26:
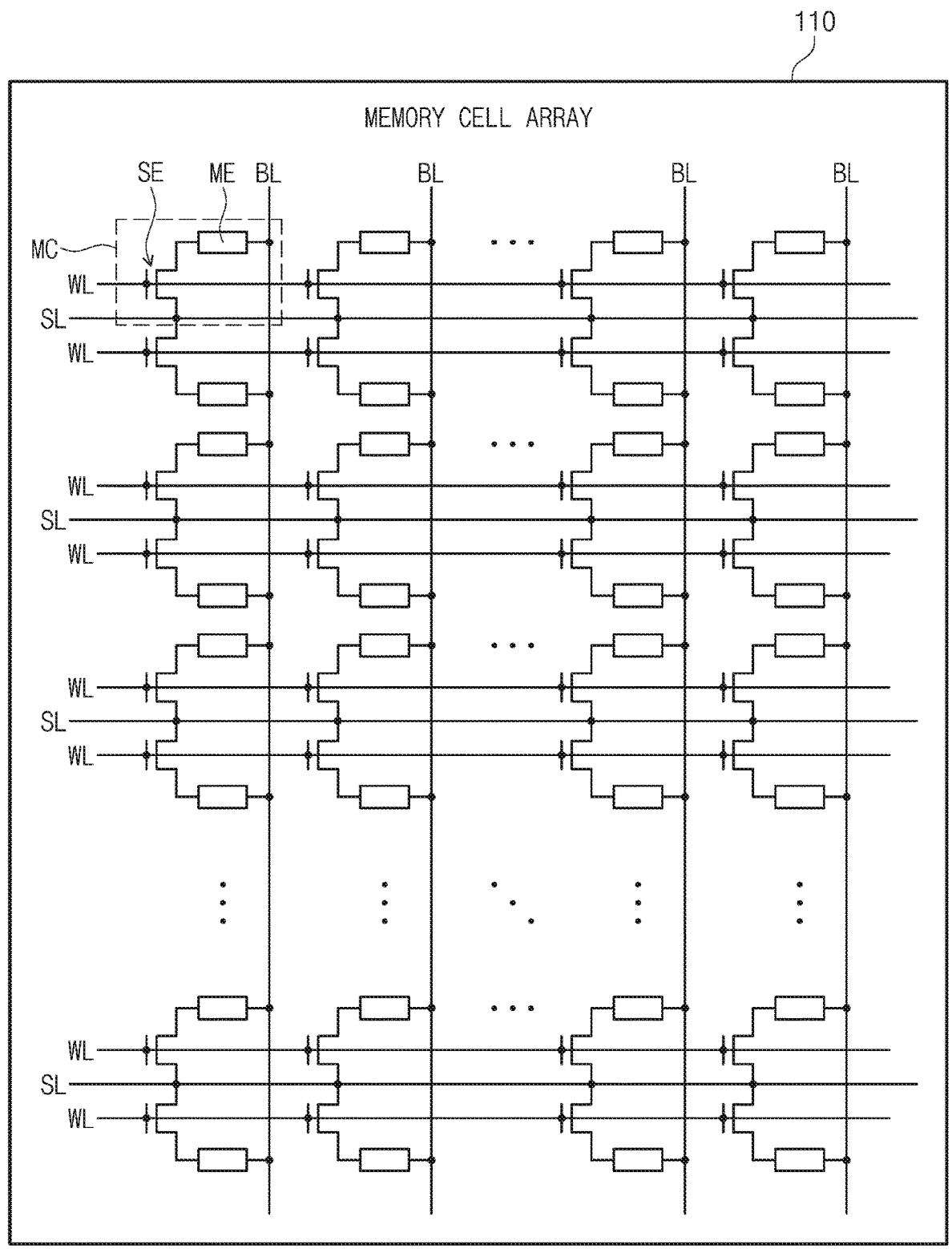
FIG. 26 is a circuit diagram illustrating a memory cell array of a semiconductor memory device according to some example embodiments of the inventive concepts.

FIG. 26 is a circuit diagram illustrating a memory cell array 110 of a semiconductor memory device according to some example embodiments of the inventive concepts.

Referring to FIG. 26, a plurality of unit memory cells MC, including magnetic tunnel junction (MTJ) may be two- or three-dimensionally arranged ("configured") to form ("at least partially comprise") a memory cell array 110. Each of the unit memory cells MC may be provided between a word line WL and a bit line BL that are provided ("configured") to cross each other. Each of the unit memory cells MC may include a selection element SE and a memory element ME including a magnetic tunnel junction MTJ. In some example embodiments, the selection element SE and the memory element ME may be electrically coupled in series to each other.

The memory element ME may be coupled between the bit line BL and the selection element SE, and the selection element SE may be coupled between the memory element ME and a source line SL and may be controlled by the word line WL. The magnetic tunnel junction MTJ of the memory element ME may exhibit variable resistance that may be switched to one of at least two values based on the direction of magnetization of the free layer FL relative to the reference layer RL.

The selection element SE may be configured to control a flow of an electric current to be supplied to the memory element ME, depending on ("based on") a voltage applied to the word line WL. For example, the selection element SE may be one of a diode, a pnp bipolar transistor, an npn bipolar transistor, an n-channel metal oxide semiconductor field effect transistor (NMOS-FET), and/or a PMOS-FET. In the case where the selection element SE is a three-terminal device (e.g., a bipolar transistor or an MOS FET), the memory cell array 310 may further include the source line SL, which may be coupled to a source electrode of the transistor. In addition, the source line SL may be provided between an adjacent pair of the word lines WL and may be shared in common by a plurality of transistors, which are coupled to the word lines WL.

Figure 27:
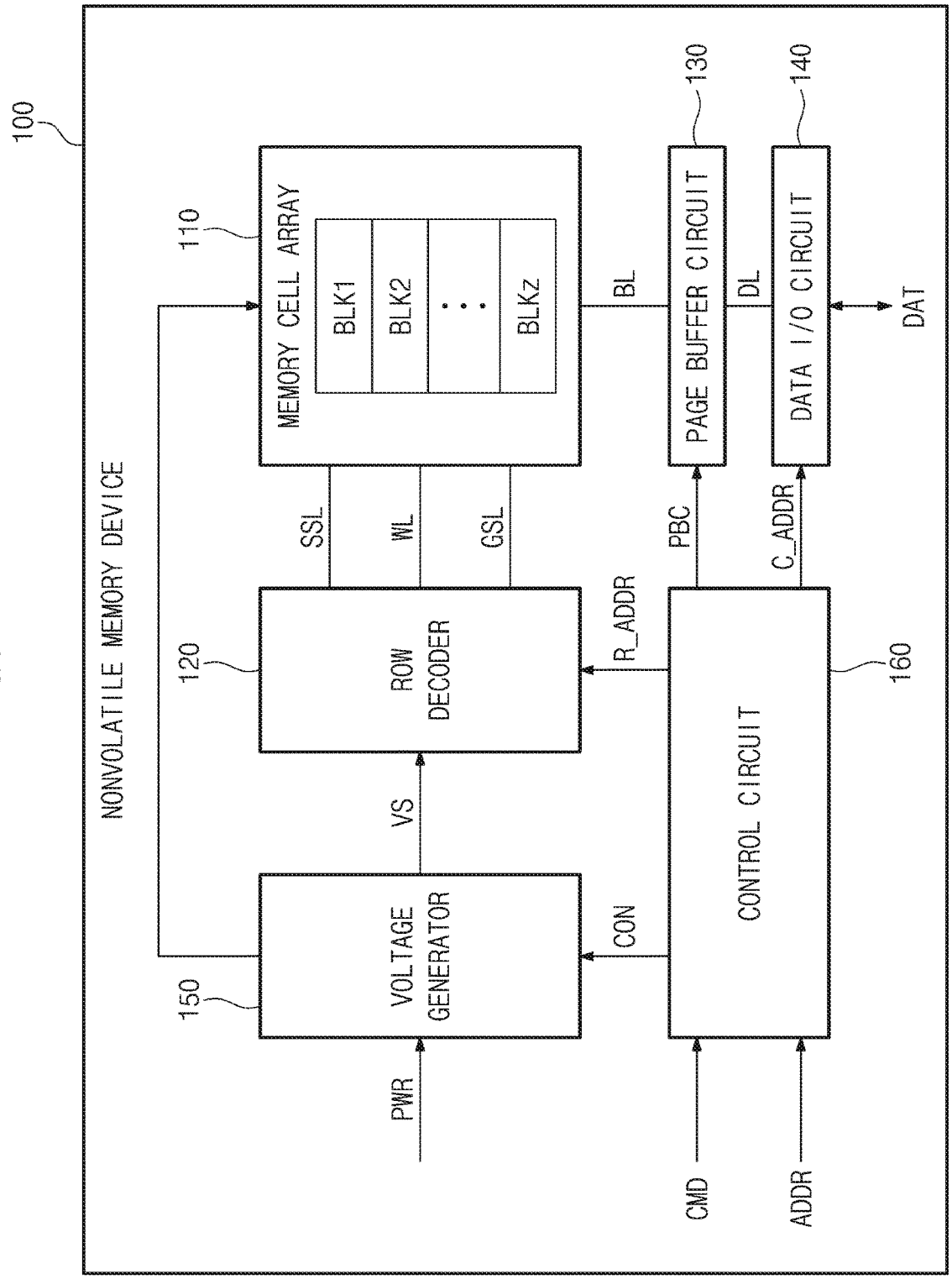
FIG. 27 is a schematic diagram illustrating a unit memory cell of a semiconductor memory device according to some example embodiments of the inventive concepts.

FIG. 27 is a block diagram illustrating an example of a nonvolatile memory device 300 including the memory cell array 110 of FIG. 26.

Referring to FIG. 27, a nonvolatile memory device 100 may include the memory cell array 110 as well as a row decoder 120, a page buffer circuit 130, a data input/output (I/O) circuit 140, a voltage generator 150 and/or a control circuit 160.

The memory cell array 310 may be connected to the row decoder 320 via a plurality of bit lines SSL, a plurality of wordlines WL, and a plurality of ground selection lines GSL. The memory cell array 310 may be further connected to the page buffer circuit 530 via a plurality of bitlines BL. The memory cell array 510 may be divided into a plurality of memory blocks BLK1, BLK2, . . . , BLKz each of which includes a group of memory cells MC, which may include a memory element ME including a magnetic tunnel junction MTJ magnetic memory device. In some example embodiments, the plurality of memory cells MC may be arranged in a two dimensional (2D) array structure or a three-dimensional (3D) vertical array structure. A three-dimensional vertical array structure may include vertical cell strings that are vertically oriented such that at least one memory cell is located over another memory cell. The at least one memory cell may include a charge trap layer. Some example configurations for a memory cell array may include a 3D vertical array structure, in which the three-dimensional memory array is configured as a plurality of levels, with wordlines and/or bitlines shared between levels.

The control circuit 160 may receive a command CMD and an address ADDR from a memory controller, and may control an operation of the memory device, such as erasure, programming and/or reading, based on the command CMD and the address ADDR. The control circuit 160 may generate control signals CON, which are used for controlling the voltage generator 150, and/or may generate control signal PBC for controlling the page buffer circuit 130, based on the command CMD, and/or may generate a row address R_ADDR and a column address C_ADDR based on the address ADDR. The control circuit 160 may provide the row address R_ADDR to the row decoder 120 and/or may provide the column address C_ADDR to the data I/O circuit 140.

The row decoder 120 may be connected to the memory cell array 110 via the plurality of string selection lines SSL, the plurality of wordlines WL and/or the plurality of ground selection lines GSL. The voltage generator 150 may generate voltages VS for operation of the nonvolatile memory device 100 based on a power PWR and/or the control signals CON. The voltages VS may be applied to the plurality of string selection lines SSL, the plurality of wordlines WL and/or the plurality of ground selection lines GSL via the row decoder 120. In addition, the voltage generator 150 may generate an erase voltage VERS for the data erase operation based on the power PWR and/or the control signals CON. The erase voltage VERS may be applied to the memory cell array 110 directly or via the bitline BL.

The page buffer circuit 130 may be connected to the memory cell array 110 via the plurality of bitlines BL. The page buffer circuit 130 may include a plurality of page buffers. In some example embodiments, each page buffer may be connected to one bitline. In other example embodiments, each page buffer may be connected to two or more bitlines.

The page buffer circuit 130 may store data DAT to be programmed into the memory cell array 110 and/or may read data DAT sensed from the memory cell array 110. In other words, the page buffer circuit 130 may operate as a write driver and/or a sensing amplifier according to an operation mode of the nonvolatile memory device 100.

The data I/O circuit 140 may be connected to the page buffer circuit 130 via data lines DL. The data I/O circuit 140 may provide the data DAT from outside of the nonvolatile memory device 100 to the memory cell array 110 via the page buffer circuit 130 and/or may provide the data DAT from the memory cell array 110 to the outside of the nonvolatile memory device 100, based on the column address C_ADDR.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device comprising:
   a magnetic tunnel junction pattern on a substrate, the magnetic tunnel junction pattern comprising a free layer, a tunnel barrier layer and a pinned layer which are sequentially stacked;
   a first spin-orbit torque (SOT) line in contact with a first sidewall of the free layer; and
   a spacer on the SOT line, the spacer in contact with sidewalls of the pinned layer and the tunnel barrier layer,
   wherein a width of a bottom surface of the spacer is substantially equal to a width of a top surface of the first SOT line.

2. The magnetic memory device of claim 1, wherein the first SOT line includes at least one of platinum (Pt), tungsten (W), tantalum (Ta), BiSb, or BiSe.

3. The magnetic memory device of claim 1, wherein the first SOT line is spaced apart from the tunnel barrier layer.

4. The magnetic memory device of claim 3, wherein a bottom surface of the first SOT line is substantially coplanar with a bottom surface of the magnetic tunnel junction pattern.

5. The magnetic memory device of claim 1, wherein the first SOT line is spaced apart from the spacer.

6. The magnetic memory device of claim 1, wherein the spacer covers a portion of the first sidewall of the free layer.

7. The magnetic memory device of claim 1, wherein the spacer comprises a first sub-spacer including a first material and a second sub-spacer including a second material, wherein the first material is different from the second material.

8. The magnetic memory device of claim 1, wherein a top surface of the spacer is substantially coplanar with a top surface of the magnetic tunnel junction pattern.

9. The magnetic memory device of claim 1, wherein
the first SOT line has a first thickness, and
the free layer has a second thickness greater than the first thickness.

10. The magnetic memory device of claim 1, further comprising a contact plug between the magnetic tunnel junction pattern and the substrate, wherein the first SOT line is spaced apart from the contact plug.

11. The magnetic memory device of claim 1, further comprising
a second spin-orbit torque (SOT) line in contact with a second sidewall of the free layer which is opposite to the first sidewall.

12. The magnetic memory device of claim 11, wherein the first SOT line is spaced apart from the second SOT line.

13. The magnetic memory device of claim 11, wherein
a first current flows through the first SOT line, the first current having a first direction, and
a second current flows through the second SOT line, the second current having a second direction, wherein the first direction is opposite to the second direction.

14. A magnetic memory device comprising:
a magnetic tunnel junction pattern on a substrate, the magnetic tunnel junction pattern comprising a free layer, a tunnel barrier layer and a pinned layer which are sequentially stacked;
a first spin-orbit torque (SOT) line in contact with a first sidewall of the free layer;
a second spin-orbit torque (SOT) line in contact with a second sidewall of the free layer which is opposite to the first sidewall; and
a spacer on the first SOT line, the spacer in contact with sidewalls of the pinned layer and the tunnel barrier layer,
wherein a width of a bottom surface of the spacer is substantially equal to a width of a top surface of the first SOT line.

15. The magnetic memory device of claim 14, wherein the first SOT line and the second SOT line are spaced apart from the tunnel barrier layer.

16. The magnetic memory device of claim 14, further comprising:
a contact plug between the magnetic tunnel junction pattern and the substrate,
wherein the first SOT line is spaced apart from the contact plug.

17. A magnetic memory device comprising:
a magnetic tunnel junction pattern on a substrate, the magnetic tunnel junction pattern comprising a free layer, a tunnel barrier layer and a pinned layer which are sequentially stacked;
a first spin-orbit torque (SOT) line in contact with at least one sidewall of the free layer; and
a spacer on the first SOT line, the spacer in contact with sidewalls of the pinned layer and the tunnel barrier layer,
wherein a width of a bottom surface of the spacer is substantially equal to a width of a top surface of the first SOT line.

18. The magnetic memory device of claim 17, wherein the first SOT contacts four sidewalls of the free layer and surrounds a lower portion of the free layer.

* * * * *